United States Patent
Walters et al.

(10) Patent No.: US 6,721,922 B1
(45) Date of Patent: Apr. 13, 2004

(54) SYSTEM FOR ELECTRONIC CIRCUIT CHARACTERIZATION, ANALYSIS, MODELING AND PLAN DEVELOPMENT

(75) Inventors: Don Walters, Aptos, CA (US); Paul Foster, Aptos, CA (US); Tina Najibi, San Jose, CA (US)

(73) Assignee: Cadence Design Systems, Inc., San Jose, CA (US)

(*) Notice: Subject to any disclaimer, the term of this patent is extended or adjusted under 35 U.S.C. 154(b) by 48 days.

(21) Appl. No.: 09/965,676

(22) Filed: Sep. 27, 2001

Related U.S. Application Data

(60) Provisional application No. 60/235,730, filed on Sep. 27, 2000.

(51) Int. Cl.[7] ............................................. G06F 17/50
(52) U.S. Cl. ..................... 716/1; 716/4; 716/5; 716/6; 716/18
(58) Field of Search ............................ 716/1–18

(56) References Cited

U.S. PATENT DOCUMENTS 5,867,399 A * 2/1999 Rostoker et al. ............ 364/489
6,044,211 A * 3/2000 Jain ...................... 395/500.19
6,145,117 A * 11/2000 Eng .............................. 716/18
6,470,482 B1 * 10/2002 Rostoker et al. ............... 716/6

OTHER PUBLICATIONS

Puchol et al. "Integrated Design Tools for Hard Real–Time Systems," IEEE, Dec. 1998, pp. 1–11.*

Senft et al, "A Graphical Design Environment for Distributed Real–Time Systems," IEEE, 1989, pp. 871–880.*

* cited by examiner

Primary Examiner—Vuthe Siek
(74) Attorney, Agent, or Firm—Fliesler Dubb Meyer & Lovejoy LLP

(57) ABSTRACT

A system is herein disclosed which allows for the interactive design and analysis of analog and mixed-signal circuits. Circuits may additionally be characterized and verified without leaving the environment provided by the system. The system may be used to analyze multiple circuit designs at the same time. In this manner a designer can create a test that sweeps over several circuit designs. Embodiments of the invention may be integrated with other circuit design tools and development systems.

33 Claims, 80 Drawing Sheets

| Design: vcotop | | | | | | | | | | |
|---|---|---|---|---|---|---|---|---|---|---|
| Test Name | Meas | Cond | Min Spec | Value | Max Spec | Pass/ Fail | Plot | Show Desig | Show Test | Show P/F |
| Tran1 | Rise time | Vcc=1 | 1n | 3n | 5n | Pass | ☐ | ☐ | ☐ | ☐ |
| Tran2 | Slew rate | Vcc=1 | 5 | 9 | 8 | Fail | ☐ | ☐ | ☐ | ☐ |
| Ac | Band width | Vcc=1 | 75k | 120k | 150k | Fail | ☐ | ☐ | ☐ | ☐ |

| Design: vcotop vcotopAMS | | | | | | | | | | | |
|---|---|---|---|---|---|---|---|---|---|---|---|
| Test Name | Meas | Cond | Ver Tol | Min Comp | Max Comp | Tol | Pass Fail | Plot | Show Des | Show Test | Show P/F |
| Temp-Volt | Rise time | Vcc=1 to 5 by 1 Temp=-55 0 27 55 | Abs | 2n | 3n | 3n | Pass | ☐ | ☐ | ☐ | ☐ |
| Corners | Rise time | Vcc=1 to 5 by 1 Model=low typ hi Temp= -55 0 55 | Abs | 1n | 2n | 3n | Pass | ☐ | ☐ | ☐ | ☐ |
| Monte | Rise time | 100 runs | Abs | 1n | 4n | 3n | Fail | ☐ | ☐ | ☐ | ☐ |

Figure 77

| Design: vcotop vcotopAMS | | | | | | | | | | | |
|---|---|---|---|---|---|---|---|---|---|---|---|
| Test Name | Meas | Cond | Ver Tol | Min Comp | Max Comp | Tol | Pass Fail | Plot | Show Des | Show Test | Show P/F |
| Temp-Volt | Rise time | Vcc=1 to 5 by 1 Temp=-55 0 27 55 | Abs | 2n | 3n | 3n | Pass | ☐ | ☐ | ☐ | ☐ |
| Corners | Rise time | Vcc=1 to 5 by 1 Model=low typ hi Temp= -55 0 55 | Abs | 1n | 2n | 3n | Pass | ☐ | ☐ | ☐ | ☐ |
| Monte | Rise time | 100 runs | Abs | 1n | 4n | 3n | Fail | ☐ | ☐ | ☐ | ☐ |

| Design: vcotop | | | | | | | | |
|---|---|---|---|---|---|---|---|---|
| Temp | VDC | Min Spec | Value | Max Spec | Sim Success | Pass / Fail | Show Log | Highlight Results |
| -50 | 1 | 1n | 7n | 5n | Yes | Fail | ☐ | ☐ |
| -50 | 2 | 1n | 6n | 5n | Yes | Fail | ☐ | ☐ |
| -50 | 3 | 1n | | 5n | No | | ☐ | ☐ |
| -50 | 4 | 1n | 3n | 5n | Yes | Pass | ☐ | ☐ |
| Etc | | | | | | | | |

| Design: vcotop | | | | | | | | |
|---|---|---|---|---|---|---|---|---|
| Temp | VDC | Min Spec | Value | Max Spec | Sim Success | Pass / Fail | Show Log | Highlight Results |
| -50 | 1 | 1n | 7n | 5n | Yes | Fail | ☐ | ☐ |
| -50 | 2 | 1n | 6n | 5n | Yes | Fail | ☐ | ☐ |
| -50 | 3 | 1n |  | 5n | No |  | ☐ | ☐ |
| -50 | 4 | 1n | 3n | 5n | Yes | Pass | ☐ | ☐ |
| Etc |  |  |  |  |  |  |  |  |

Waveform Import

Figure 79

| Design: vcotop | | | | | | | | | | |
|---|---|---|---|---|---|---|---|---|---|---|
| Test Name | Meas | Cond | Min Spec | Value | Max Spec | Pass/ Fail | Plot | Show Sch | Show Test | Show P/F |
| Tran1 | Rise time | Vcc=1 | 1n | 3n | 5n | Pass | ☐ | ☐ | ☐ | ☐ |
| Tran2 | Slew rate | Vcc=1 | 5 | 9 | 8 | Fail | ☐ | ☐ | ☐ | ☐ |
| Ac | Band width | Vcc=1 | 75k | 120k | 150k | Fail | ☐ | ☐ | ☐ | ☐ |

SYSTEM FOR ELECTRONIC CIRCUIT CHARACTERIZATION, ANALYSIS, MODELING AND PLAN DEVELOPMENT

This application claims priority from provisional application "SYSTEM FOR ELECTRONIC CIRCUIT CHARACTERIZATION, ANALYSIS, MODELING AND PLAN DEVELOPMENT," Application No. 60/235,730, filed Sep. 27, 2000, and which application is incorporated herein by reference.

FIELD OF THE INVENTION

The invention relates to electronic circuit design and specifically to an interactive environment to support circuit design, characterization, analysis, model development, and plan development and usage.

BACKGROUND OF THE INVENTION

Circuit level designers typically develop electronic circuits using plans, the most commonly encountered plans being Characterization Plans and Synthesis Plans which have much in common, though their end purpose is very different. In both cases, designers need tools to assist in characterizing and verifying the circuit (i.e. acquiring characterization results for the circuit through simulation), tools to assist visual and data processing analysis of the characterization results, tools to assist in creation of behavioral models for a circuit, and to provide mechanisms to enable reuse of characterization efforts in development of plans and for characterization of other designs.

Traditionally these tools have been supplied piecemeal, often by a variety of different manufacturers, which leads to inconsistencies and to much lost time and money as developers learn to master multiple complex systems.

SUMMARY

A primary goal of the invention is to support the plan development process as much as possible (characterization, model generation and synthesis plans), but also to provide a system that makes it easy to create and analyze characterization results even if no plan is being developed.

Although the invention can be used to run simulations to capture results, it is not merely a simulator front-end. Other applications may provide this particular functionality. The major features of the invention can be summarized as follows:

An environment which allows for interactive exploration of design characteristics, i.e. the ability to build/run tests and collect/analyze data.

The ability to generate and verify behavioral models for circuits.

Support for the development of reusable plans in Perl.

Provides libraries for storage of plans.

An intuitive GUI interface that allows the user to focus on the task at hand, rather than focusing on how to operate the tool.

Uses terminology familiar to analog designers when possible.

Does not require the plan developer to learn languages for standard functions, and for advanced users, allow the designer to accomplish all tasks using standard function sets including: Verilog-AMS, Perl and Matlab.

Straightforward integration of schematic-capture systems into the development and testing flow.

Components of a plan and the plan itself may be reused (e.g. a test to measure open loop gain could be shared for multiple op-amps tests).

Support for distributed processing and parameter sweep unrolling for simulations.

BRIEF DESCRIPTION OF THE FIGURES

Figure 73:
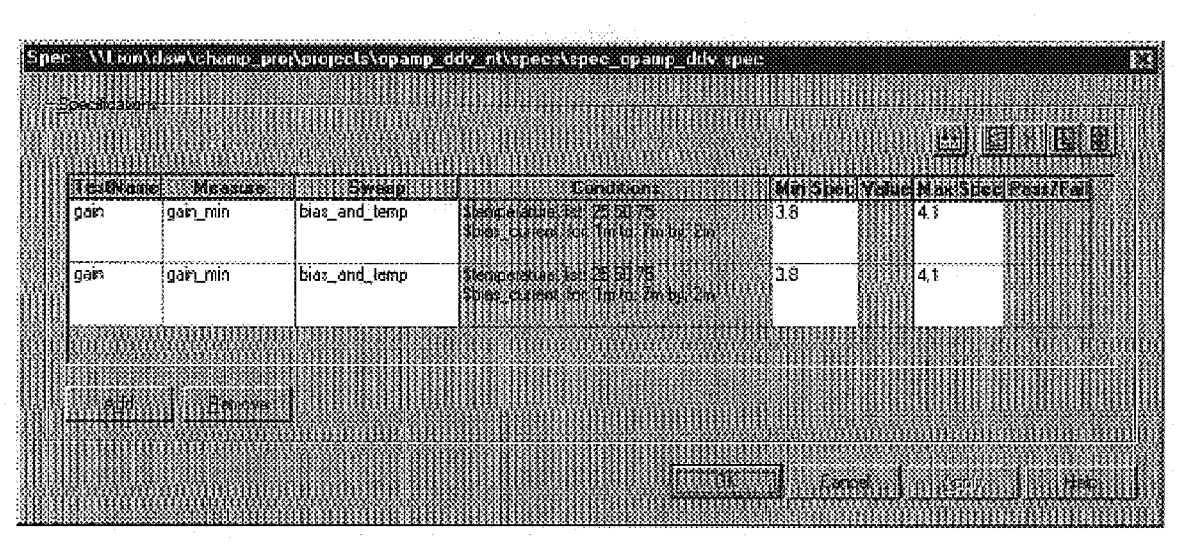

FIGS. 69–75 show an embodiment of the invention.

FIGS. 75–80 show GUI's for use with a further embodiment of the invention.

DETAILED DESCRIPTION

Figure 1:
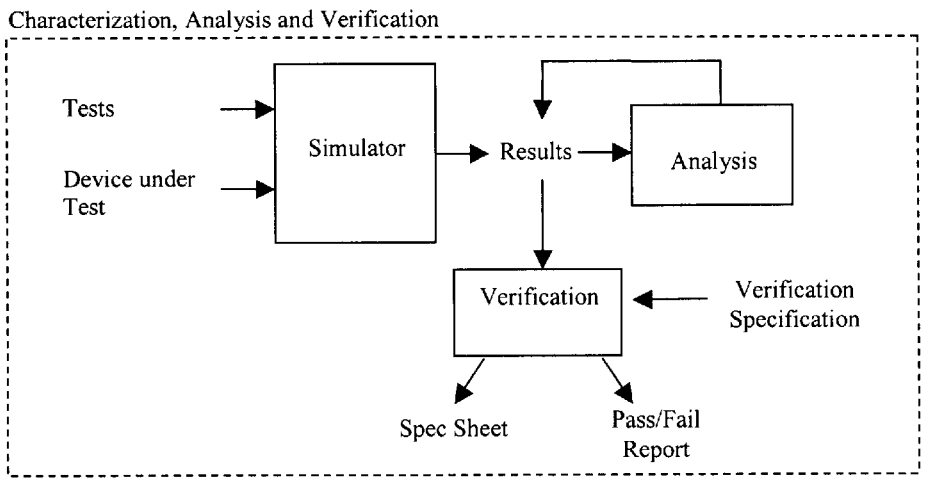
FIG. 1 shows a schematic of the Characterization, Analysis and Verification process.

The invention will now be described with reference to the accompanying figures. A glossary is included below which will prove useful in better understanding the various embodiments.

Library Mapping File A file that describes the locations of the libraries used in the current project.

Project File A file that defines the options for the current project. In the file, options are grouped into global options that pertain to all tools (for example, the location of the Library Mapping File, library names used in the project, etc.) and tool options (i.e. project-specific tool settings).

Cell A directory in a library that represents an individual piece of design-IP that may be reused across design implementations. It may be a design that references other cells or it may be a leaf cell. Cells have one or more views that contain models, schematics, or other data related to the cell design.

Library A directory that contains a collection of cells.

Project Directory A directory that contains the files for a project. At minimum, the directory contains a projectfile, a library mapping file, and a working library to contain the cells being created/edited for the project.

View A directory that contains a collection of files that represent a specific representation of a cell (e.g. unsized Spice netlist, sized Spice netlist, optimizer data, schematic, symbol, layout, etc.). Normally a tool will put its output data into a single view (and receive some of its input data from one or more other views). Views are named by the user and can be named to represent different versions of the same type of view.

Behavioral Model A high-level description of the behavior of a mixed-signal function.

Calibrated Model A shorthand name for a Silicon Calibrated Behavioral Model.

Characterization The process of simulating a set of Tests and acquiring data.

Characterization Plan A Perl script and associated Tests that define the steps necessary to create Characterization results.

Components The Verilog modules or Spice sub-circuits referenced in a Test.

Core Behavioral Model A parameterized behavioral model to be instanced by a Calibrated Model.

Data Analysis An interactive or automated process of viewing or manipulating acquired data.

DUT Device Under Test—The model or circuit that is being Characterized.

Global Variables Perl variables used to associate the same value with one or more Parameters or Simulation Controls in one or more Tests.

Matlab® A mathematical and visualization tool set provided by Math Works, Inc.

Measure Functions to measure and store simulated results (e.g. a Verilog-AMS module or Matlab script).

Model Generation The process of generating a Silicon Calibrated Behavioral Model™ using a set of DUT characteristics acquired during Characterization.

Model Generation Plan A Perl script and associated Tests that define the steps necessary to generate a Silicon Calibrated Behavioral Model™ for a target DUT.

Model Verification The process of evaluating the generated Behavioral Model and comparing the results to those obtained from simulation of the DUT.

Perl The scripting language used for defining Simulation Controls and Plan steps.

Plan A Perl script which defines the steps to be taken for a process (e.g. Characterization Plan, Model Generation Plan, Synthesis Plan).

Result Data A file or set of files containing the results of Characterization and Data Analysis.

Silicon Calibrated Behavioral Model™ A Verilog model that instances the Core Behavioral Model and defines real values (based on characterization results) for the parameters to accurately reproduce the behavior of a transistor-level circuit. The Silicon Calibrated Behavioral Model™ is well known to one of skill in the art.

Simulation Controls The analysis, simulation options, etc. specified for a Test.

Spec Sheet A project file that defines performance goals for a design. A spec sheet sets conditions to be evaluated and is used to verify that measure values meet the specification.

Stimulus An independently controlled voltage, current source or digital test vectors for the purpose of supplying signals to the DUT.

Sweep A project file that defines how Global Variables should be varied over Tests to produce Characterization results.

Synthesis Plan A Perl script, associated Tests, and netlist elements that define the steps necessary to create a given class of circuit that meets given performance criteria.

Test A project file that references a DUT and defines a set of Measures, Components and Simulation Controls.

Test Nets The nets in a test (used to connect the DUT to the Test Components).

Architecture

An embodiment of the invention is incorporated into a circuit analysis and development system. The following sections detail the features and advantages of the system.

Use Models

Figure 2:
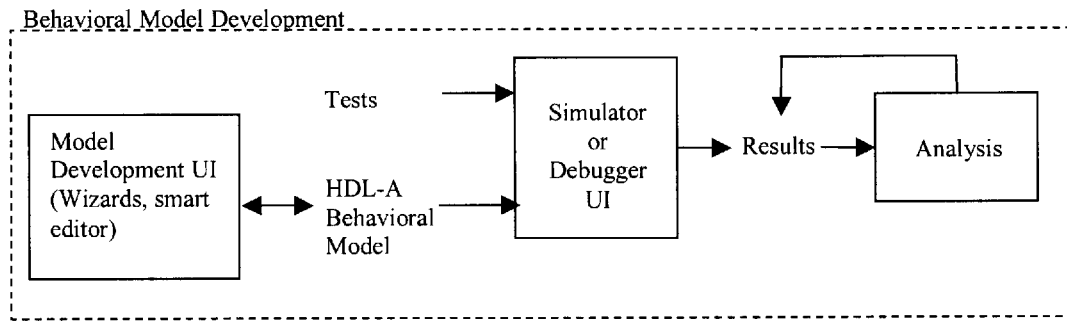
FIG. 2 shows a schematic of the Behavioral Model Development process.

A specific embodiment of the invention provides for an integrated environment which supports Characterization, Analysis, Modeling, and Plan development environment The following use models are supported by the system:

Characterization, Analysis and Verification
Behavioral Model Development
Silicon Calibrated Behavioral Model™ Generation
Model Verification
Plan Development
Plan Usage Characterization, Analysis and Verification This is normally an interactive process involving setup and execution of simulation jobs on a circuit to produce results, followed by the analysis of those results (visually or through data analysis scripts) to see if a target behavior or performance goal was met. FIG. 1 shows a schematic of the Characterization, Analysis and Verification process Behavioral Model Development In the development environment provided by the invention there are two main situations in which the designer may choose to create a behavioral model: In a top-down design flow, the designer may chose to create a behavioral model of a circuit to be used in system simulation. When creating a model generation plan the designer must create the parameterized core behavioral model. Once the model has been created, the designer can create tests to verify that the model behaves as expected. FIG. 2 shows a schematic of the Behavioral Model Development process.

Silicon Calibrated Behavioral Model™ Generation

The generation of a Silicon Calibrated Behavioral Model™ requires several steps:

Create the parameterized core behavioral model.

Obtain results from characterization of the transistor-level circuit.

Figure 3:
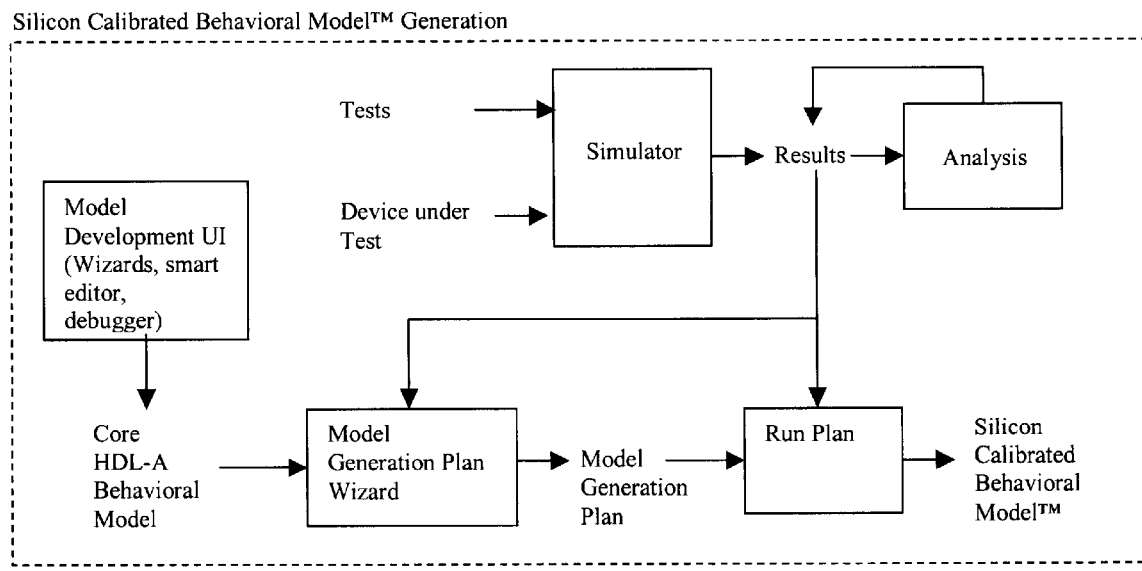
FIG. 3 shows a schematic of the Silicon Calibrated Behavioral Model™ Generation process.

Create the model generation plan, which is a Perl script that generates the calibrated model. The calibrated model is a model that instances the core behavioral model and defines real values (based on characterization results) for the parameters. FIG. 3 shows a schematic of the Silicon Calibrated Behavioral Model™ Generation process.

The Model Generation Plan wizard may prompt the user for input on how to map results to core model parameters. Possible mechanisms include straight mapping of a single value (or min, max, average, etc.), curve fitting or user supplied expressions, and lookup table creation. When the plan is generated, the user input can be changed by modification of the Perl Plan. An alternative embodiment saves the user's input that generated the plan for subsequent modification.

Model Verification

Model Verification includes two forms. The model may:

Verify that a single DUT meets given performance criteria; or,

Check that results from Tests for one DUT are the same (within some tolerance) as the results for another DUT. Typically this process would be used to ensure that a behavioral model provides the same functionality as the DUT. However the process could also be used to verify that a new implementation of a DUT circuit is still functionally equivalent to the old implementation.

Figure 4:
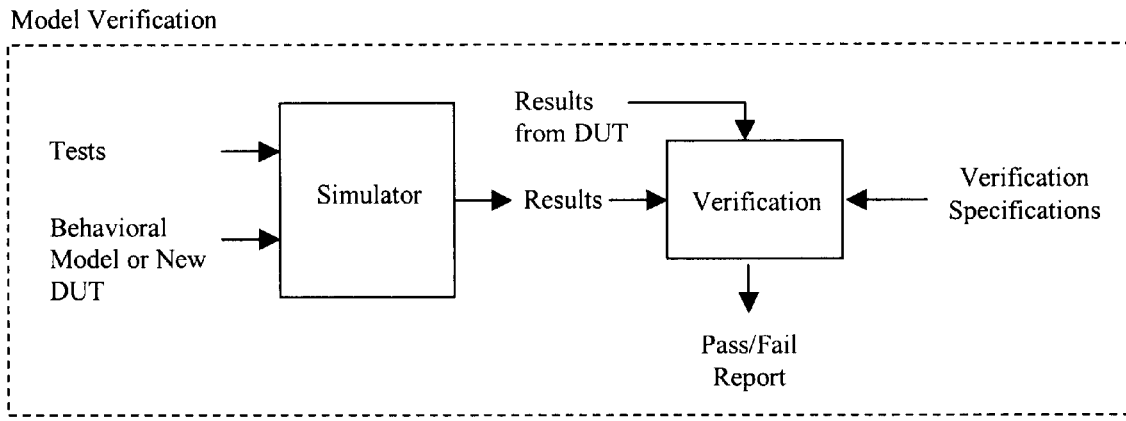
FIG. 4 is a schematic of the Model Verification process.

FIG. 4 illustrates the flow for the comparison of two results.

Plan Development

A Plan is a Perl script that runs Tests/Sweeps and performs any other functions necessary to accomplish a task. The following types of plans may be created:

Characterization Plan—to obtain characterization results for a circuit

Model Generation Plan—to generate a Silicon Calibrated Behavioral Model™ for a circuit Synthesis Plan—to generate parameter values for a circuit to meet given performance criteria Plan development wizards may be used to prompt the user for selections and then generate an initial Perl Plan. When the plan has been created, it can be further edited with a text editor. Plans can be invoked either from within the development environment, or from the command line. A plan may be given an argument that identifies the current project to run in, so it knows its context. If a plan is run within the development environment, the environment itself provides this argument automatically. If run outside the development environment, the argument can be given on the command line.

Figure 5:
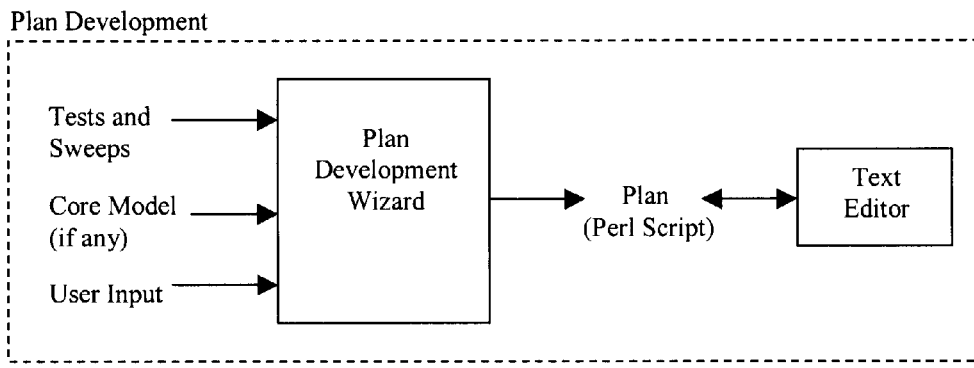
FIG. 5 shows a schematic of the Plan Development process.

If a plan is invoked from within the development environment, it will be run as a simple Perl script and will have no direct interaction with the environment itself. Perl extensions can be integrated with the Perl engine to allow the plans to run tests/sweeps and to query/store results. Multiple plans may be used in a project (e.g. one plan might simply create characterization results for the circuit, while another would generate a behavioral model). One plan may also run other plans. FIG. 5 shows a schematic of the Plan Development process.

Plan Usage

Plans can be invoked either from within the development environment, or from the command line. Plans may accept a pointer to a project .apf file and will run within that project to produce results or other project data. Plans that do not require the user to modify environment components can be run outside of the UI. Synthesis plans may be run in this fashion since the underlying DUT/netlist and steps for the plan will always be the same.

Figure 6:
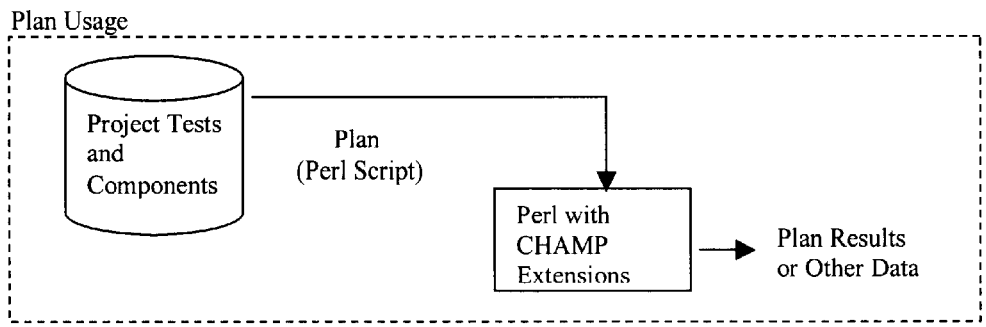
FIG. 6 shows a schematic of the Plan usage process.

Plans that do require modification to environment components are normally run from within the development environment proper. Characterization plans will ideally run in this fashion since the user must modify the test files to reference a different DUT before the characterization runs can proceed. In one embodiment, the plan prompts the user with an explanation of the required steps and waits for the user to click OK before continuing to the next step. Plans that must prompt the user for input can use, for example, Perl/Tk to provide GUI input windows. FIG. 6 shows a schematic of the Plan Usage process.

Data Flow

Figure 7:
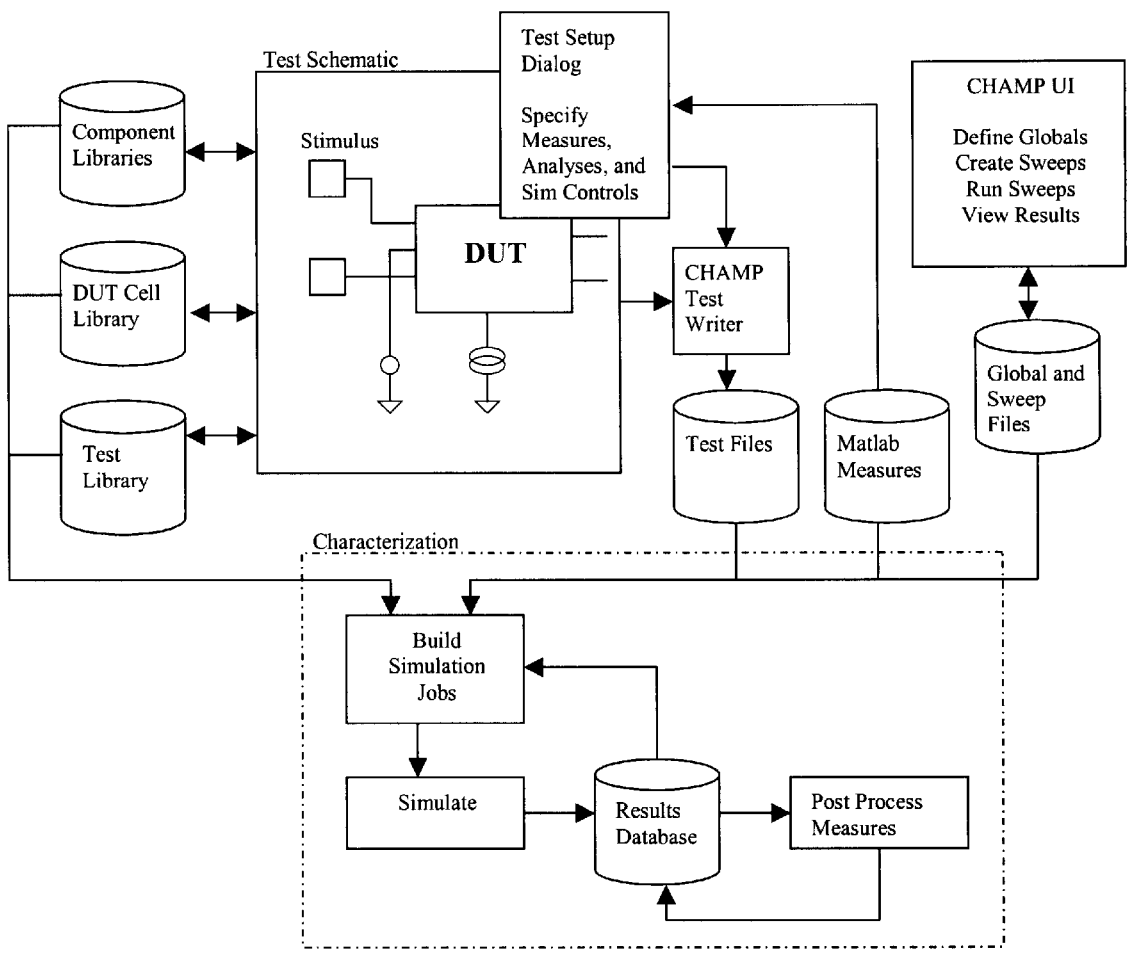
FIG. 7 shows a schematic of the data flow used for creation of the characterization component.

Schematic Design Capture—The design elements used by the environment can be defined either with a schematic editor or as text Verilog-AMS files. FIG. 7 illustrates the data flow used for creation of the characterization components using a schematic editor.

In the schematic flow, shown in FIG. 7, designers create a Test schematic that instantiates the Device Under Test (DUT) and any stimuli or other components needed for the test. The designer can select Setup Analyses, Setup Simulation Control or Setup Measures to be given a dialog to set these options. The designer may also create new projects, netlists or tests.

Textual/GUI Design Capture

Figure 8:
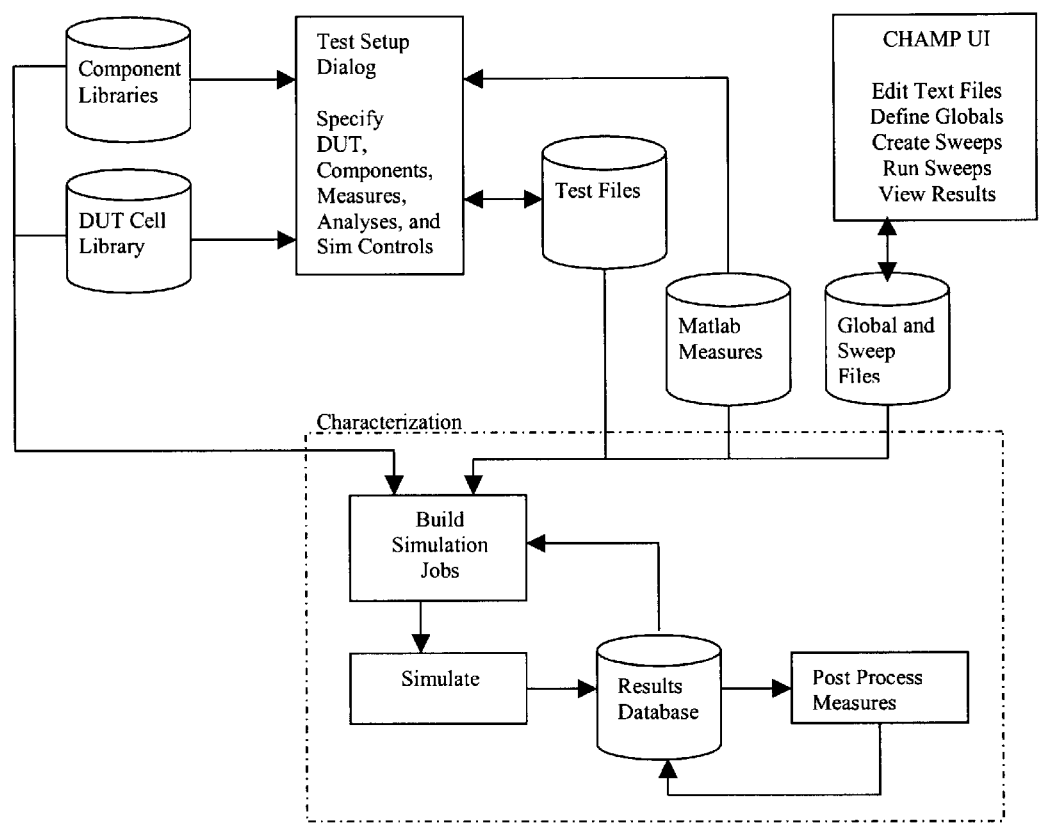
FIG. 8 shows a schematic of the data flow used for creation of the non-schematic test.

The data flow for creation of non-schematic Tests is shown in FIG. 8. This flow resembles the schematic flow, except that a GUI dialog is provided to allow the user to reference the necessary test elements. Test elements may be created using a text editor or using an integrated context sensitive editor. The Test Setup dialog is the same dialog used in the schematic flow, but it contains extra tabs to allow specification of the DUT and other design components.

Functional Capabilities

A primary goal of the invention is to provide tools that support the creation, running and analysis of characterization simulations, while also leading the user toward the steps of creating behavioral model templates and characterization plans. To accomplish this the invention uses methods and functional elements which keep the steps simple, and stay within the terminology of designers as much as possible. The system architecture relies on special-purpose parsers to extract needed data from circuit descriptions written in their natural language, so the user normally does not need to understand any other intermediate representation formats or languages.

While the functionality of the development environment provided by the invention provides an environment for setup, creation and analysis of characterization data, it also provides mechanisms to allow special-purpose tools to be used for other flows (for example, support for the MSS optimizer for synthesis plans).

Projects

In one embodiment of the invention the user must define a project directory. This directory will be used to store the test elements for the project, and will also be used to store the simulation results and results from other tools. Projects can be created, opened, and archived. Projects can be created based on previously created projects. Thus, a project could be created named "opamp_model_gen" and archived. Future projects could then be created that use the "opamp_model_gen" files and settings as a starting point.

Cell Libraries

When the user creates a project, that project will contain a working library. This library can be used to store design files as lib/cell/view. When the user needs to access a DUT circuit, a lib/cell/view browser will be presented to allow them to select the proper circuit description file (i.e. spice, Verilog-a). In addition, when a behavior model is created for a target DUT, the model will be stored as a view for that cell. The libraries used by the invention can be the same libraries as used by other products since both are organized as lib/cell/view directories.

Project Files

Project file components may be any of the following:

Built-in stimuli (e.g. Piecewise Linear)

Any Verilog-AMS module (file suffix .v or .va)

Any Spice sub-circuit (file suffix .ckt or .spc)

The invention provides libraries with a standard set of components (i.e. subckt files that instance a resistors, capacitor, iac_source, idc_source, etc.). A component can be anything that can be represented in Spice or Verilog, including Verilog measures. All of the above will be added to the simulation file. The following lists the items added based on the type:

Test Items Added to Simulation Deck

Built-in stimuli—A definition of a Verilog module or Spice sub-circuit, and an instance of the module/subckt in the test module.

Verilog-AMS module—A mechanism such as a .include line pull in the Verilog module file, and an instance of the Verilog module in the test module.

Spice sub-circuit—A mechanism such as a include line to pull in the sub-circuit file, and an instance of the subckt in the test module.

Measures

Other AMS runtime-server Measures are fully supported. These measures will be run using the standard AMS measure commands. In other embodiments the invention provides mechanisms for the user to define their own .m measures.

Tests

Tests define all of the stimuli, measures and values necessary to obtain a given result, and may comprise the following:

- A single DUT
- Zero or more components
- Parameter values for the DUT, components, and measures
- Other Perl simulation controls/commands (and control values)
- Net names to be used to connect DUT to the components
- Connection mapping between components, measures and DUT
- Zero or more measures A test can be saved even if some of the above items are missing or not completely defined. Parameter values for tests are stored as strings, and only converted to numeric values when necessary. In this way the original engineering notation modifiers can be preserved. Values can be entered as follows:

- Single value (numeric or text based on type of data)
- Perl $global-variable-name or Perl expression
- A Perl function call that references the result of another Test

Sweeps

Characterization results are obtained by creating sweeps that define a range of values that should be applied to one or more global variables when running tests. Sweep values can be defined as a list of values, or as a from/to/by range. In addition, Sweeps define the tests they should be run on. A sweep may be applied to multiple tests.

Spec Sheets

Spec Sheets are created to define performance goals for a design. The conditions to be evaluated and the allowed measure values are given, and the spec can be run to verify that the results match the specification. If errors occur, spec sheets provide mechanisms to find the tests that generated the bad results.

Plans

Plans are Ped scripts and can be created and run at any time. Plans have a suffix of .pl. Plan scripts will typically be closely tied to the Tests they are written for but can be stored anywhere the user chooses.

Global Variables

Values for parameters can be Perl expressions that reference Global Variables. There is always a global variable table and variables can be referenced by entering the name as $global-variable-name (i.e. names must begin with a $ character). Global variable values can be either a numeric valve or a string. If a parameter is given a value that contains $name, the Global Variables list is checked for that name. If the name is not found, the user is asked if a new variable should be created and the name is added to the list (otherwise the value is not valid and the user must correct it).

Creating Tests

The user creates a test by modifying an existing test and saving it with a different name, or by creating a new test from scratch. Components, Measures or Simulation Controls may be added/modified in any order.

As tests are created, pins and parameters also appear in the GUI when components are added. Normally the parameters will have default values. In addition to viewing the test values using the test dialog, the user will be able to see a textual view of the simulation control file (i.e., the Verilog and Perl that will be passed to the simulator).

Running Sweeps

When at least one test and sweep is defined, the sweep can be Run. Running a sweep causes one or more simulation files to be generated, and the output results data is captured. Simulations can be distributed across multiple machines, and separate jobs will automatically be created as appropriate based on the parameter value types being swept. Result files will be saved. A separate result file will be created for each sweep/test combination.

Running Tests

A test can also be run without a sweep. In this case, a single simulation is run using the test values and any global variables referenced in the test. Running a test causes one or more simulation files to be generated, and the output results data is captured. Simulations can be distributed across multiple machines, and parameter sweeps can be automatically unrolled into separate jobs. As with sweep runs, result files will be saved in the results sub-directory. A result file will be created and be named based on the test.

Debugging Tests

A test can also be run using the Verilog-A debugger. This mechanism is most useful if the DUT consists of a Verilog-A model. Debugging a test will start the simulator and display the DUT Verilog file. The simulation will be halted at the first line of Verilog-A and the user can then set breakpoints, examine variables, and continue, etc.

Viewing Results

Once a test has been run, the run data can be viewed using any appropriate tool. Results from measures are stored in the result file, and can be viewed as graphs or tables. From the table display, the user can also select a single simulation result set and use a third-party tool, for example, Undertow to display the waveforms for that simulation run.

Analyzing Results

The system disclosed provides access to the AMS standard runtime-server Matlab functions to perform measurements on the results. Bandwidth, rise-time, slew-rate, min, max, delay, etc. are a few of the functions available. In other embodiments the invention supports user written Matlab functions. If the user has a full Matlab license, they can write Perl scripts that are run after the tests are run.

Model Generation

There are four main steps associated with Model Generation:

- Develop/run necessary tests/sweeps to obtain characterization results for the target device
- Create the Core Model
- Run the Model Generation Wizard to create the Model Generation Plan (a Perl script)
- Run the Model Generation Plan to produce a Calibrated Model The Core Model is a behavioral model whose behavior is determined by supplied parameters. The Model Generation Wizard can prompt the user to determine how the result data should be mapped to the core model parameters, and which names to be used for pins.

The output of running the wizard is a Perl Model Generation Plan. Running this plan will produce a Calibrated Model, which is a wrapper model that defines the parameters and instances the core model.

Verification

There are two types of verification:

- Verifying that the design performs according to specification
- Verifying that the results obtained from a model match those from the original design, or that one revision of a design matches the results of another For the first type, a spec sheet GUI allows the user to enter the specs that must be met. A spec sheet can be run against a set of result data and pass will be displayed next to those measurements that were achieved and a fail will be displayed next to those that did not meet the required specification. A user can then click on any of the fails to examine the results further to help determine the cause of failure.

A similar GUI allows the user to specify the criteria for comparison of the results from two different models. This spec sheet can be run against two sets of result data, and a pass will indicate that the results of the model match the design within the specified criteria. In addition to a tolerance (reltol/abstol) check, other methods such as mean square, surface comparison, or a check that a waveform is entirely within a region can be used to verify that the results match.

Plan Creation

When one or more tests and sweeps have been created, a Plan can be created. Wizards will be provided to guide in the initial creation of a plan. Once the plan is created, it can be edited with the integrated text editor or any other editor. The wizards list the existing tests/sweeps and allow the user to make choices on which tests to run and in which order.

Environment Options

The system of the invention allows the user to specify both project-based options, and user preferences. Project-based options affect the generation of the data. Examples include:
  Save RAW file after simulations
  Stop on first simulation failure
  User preferences are options that affect the way data is displayed or that affect the way the GUI behaves
  Colors for context sensitive editors
  Options for display of progress of simulation
  Burst licensing choices and machine list Environment Commands Perl commands are needed to allow Plans to perform the following tasks:
  Run tests
  Run sweeps
  Read results of tests into Perl variables
  Generate tables from results for calibrated model generation
  Verify results (i.e. compare results for one DUT with those of another)

User Interface

An important part of the development environments data organization is the fact that design files can be organized in to libraries, which contain cells, which contain different views of implementations of that cell. Thus, the designer can experiment with different versions or representations of the same design. For example, one view may be the spice implementation of a cell, and another could be the Verilog-A behavioral model.

Creating a Project

Figure 9:
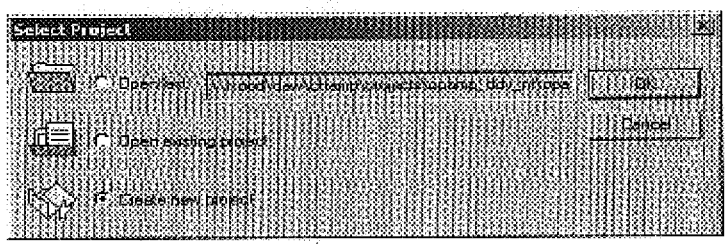
FIGS. 9–68 show screenshots of an embodiment of the invention.
Figure 10:
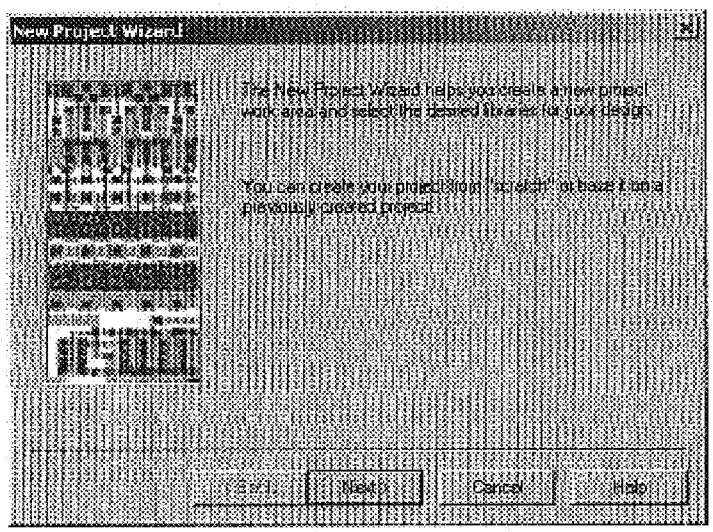
Figure 11:
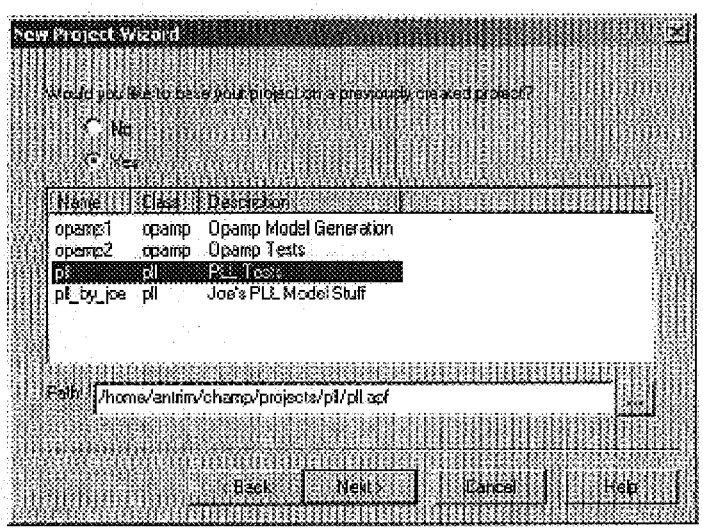
Figure 12:
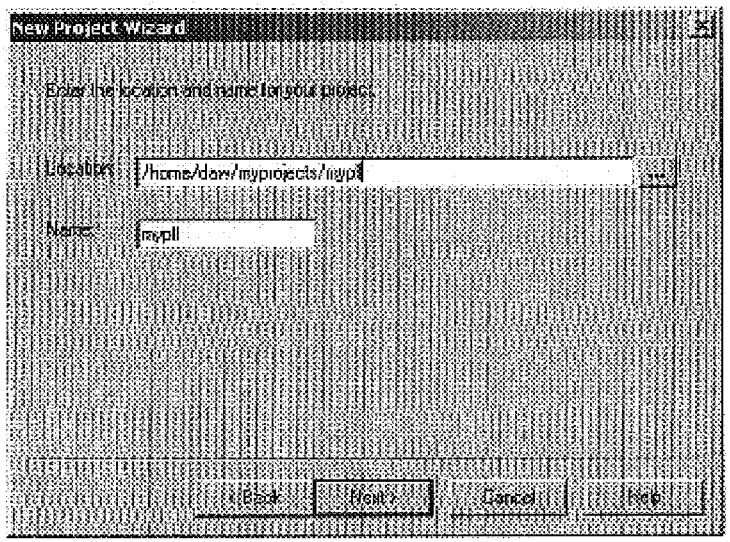
Figure 13:
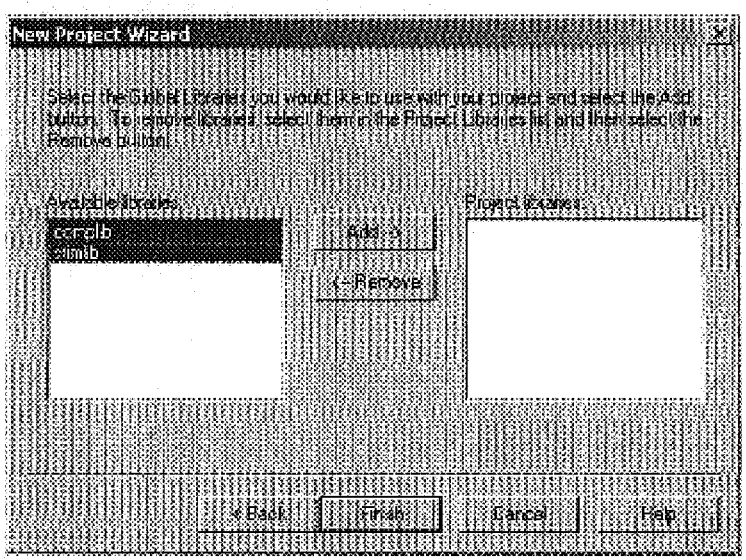

When the user first initiates the development environment provided by the invention, they must point the environment to a project. When the tool first starts, it presents a dialog that looks something like that shown in FIG. 9. The system will remember the last project, so normally the user only needs to click OK (the Open Last radio button will already be selected). Or they can select Open an Existing Project and OK and they will be given a file browser to find a Property File. Or they can select Create a New Project and OK and they will be given a series of wizard dialogs to make it easy to create a project. The wizards may appear as shown in FIGS. 10–13.

Main Window

Figure 14:
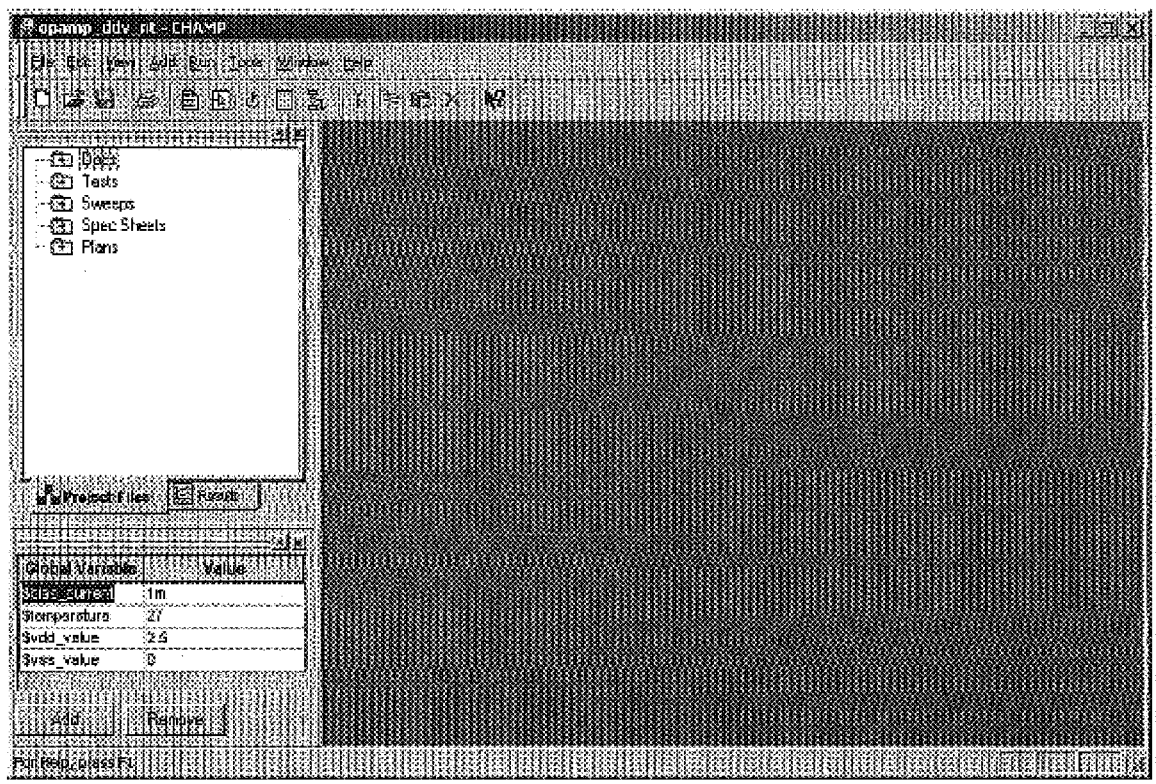

Once a project is open, the window may look something like that in FIG. 14. The window contains standard GUI components like a menu bar and toolbar. It also has a couple of dockable windows to display Project Files (i.e. Documents, Tests, Sweeps, Spec Sheets and Plans), Results, and Globals.

Docking Windows

Figure 15:
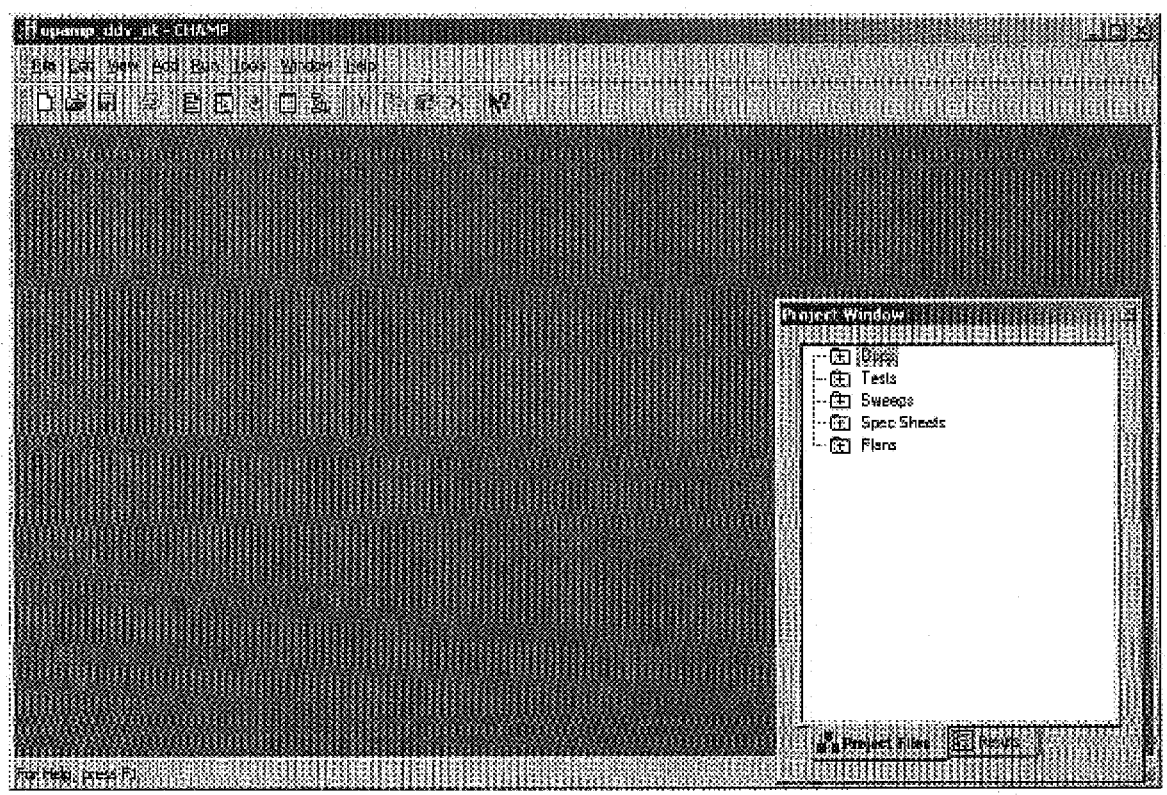
Figure 16:
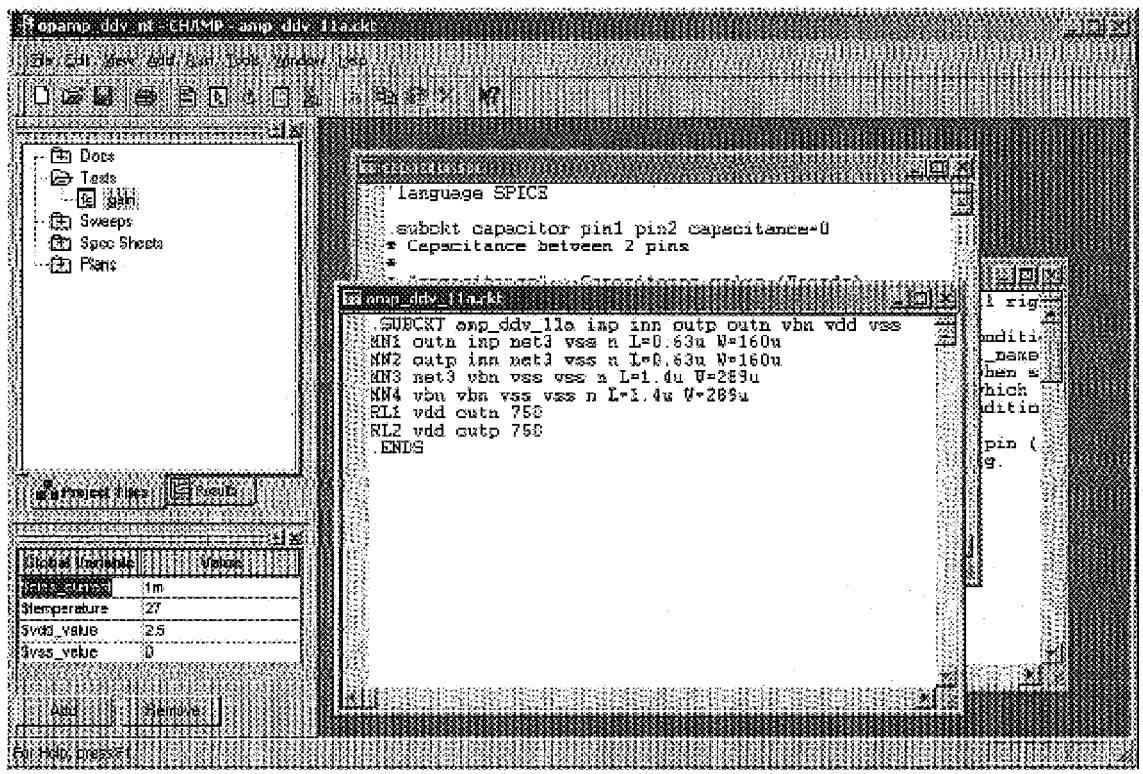

When appropriate, docking windows will be provided instead of designating specific screen locations for control windows. Docking windows (like toolbars) can be undocked, moved to other locations and sizes. They can also be completely hidden. This gives users full control over the screen space. For example, a user could close the Globals window, and the remaining window could be undocked to look like FIG. 15. The user's window and toolbar position preferences are saved between sessions.

Main Menu Bar

Figure 17:
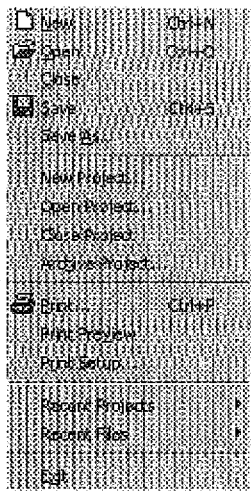

A main menu bar such as is shown in FIG. 17 makes it clear to the user what functions are available. Functions that cannot be run because of some other dependency are grayed out.

File Menu

Figure 18:
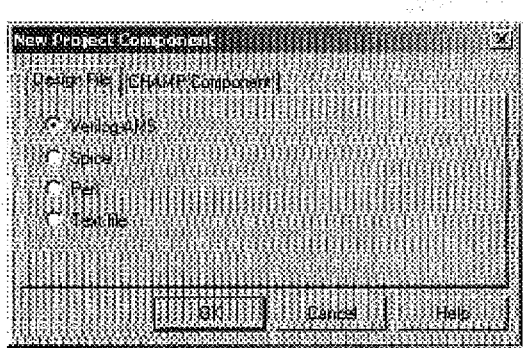
Figure 19:
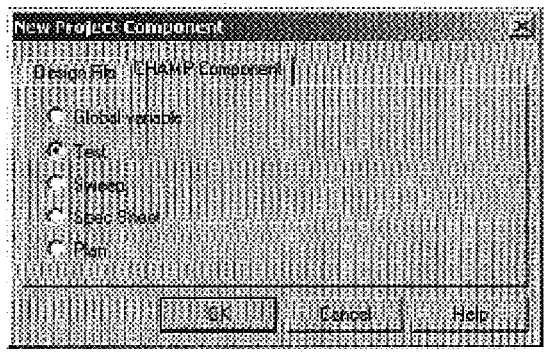

A file menu allows the user to open files projects, etc., and to save them in various formats. When the New...menu is chosen, the dialog of FIGS. 18 and 19 is displayed. The type of component to be created must be selected before pressing the OK button.

Edit Menu

Figure 20:
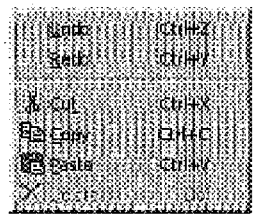

An Edit Menu is shown in FIG. 20 and allows the user to undo, redo cut and paste items, etc.

View Menu

Figure 21:
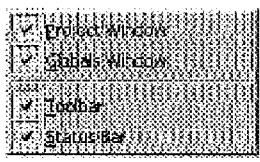

A View Menu is shown in FIG. 21 and adjusts the graphical presentation of the users screen.

Add Menu

Figure 22:
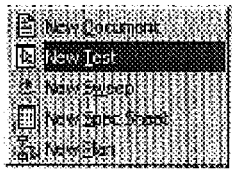

An Add Menu is shown in FIG. 22 and allows new tests, sweeps and plans to be added.

Run Menu

Figure 23:
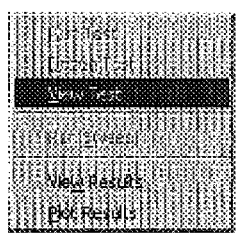

A Run Menu is shown in FIG. 23 and allows the developer to start a test or sweep run.

Tools Menu

Figure 24:
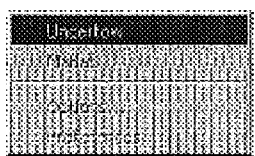
Figure 25:
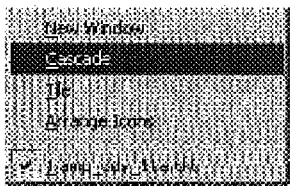

A Tools Menu is shown in FIG. 24 and enables integration with tools such as Undertow and Matlab Window Menu A Window Menu is shown in FIG. 25 and allows the user to arrange the application windows as desired.

Help Menu

Figure 26:

A Help Menu is shown in FIG. 26 and includes context sensitive help screen.

Context Sensitive Menus

Figure 27:
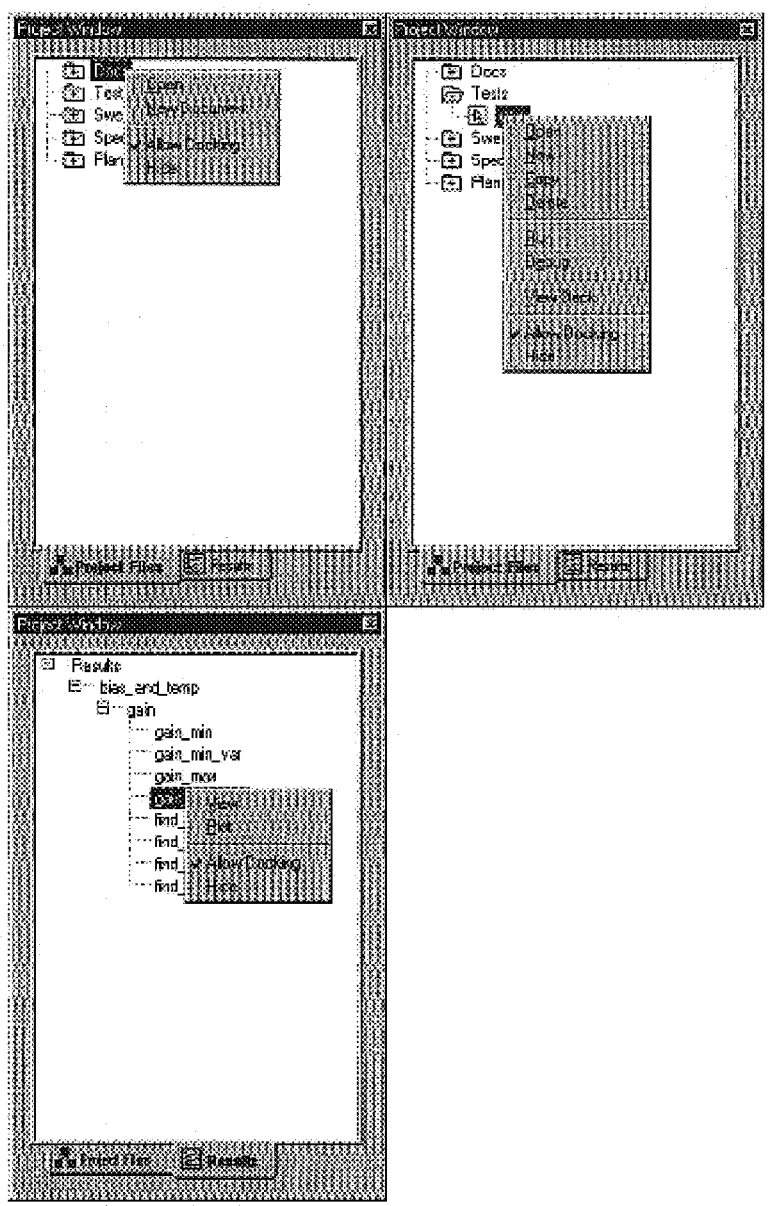

Context sensitive menus may be provided throughout the GUI. These are viewed by clicking the right mouse button and the content of the menu is based on the selection and location. Shown in FIGS. 27a–c are three examples. The first is the result of right clicking on the Docs item in the Project Files window. The second is the menu shown by right clicking on a Test name. The third is the menu shown by right clicking on a result item. The functions provided by the popup menus is identical to the functions that can be accessed from the top-level menu bar.

Text Editor

Normally users will create a test using a library browser to find pre-created items, but if necessary they can also create new stimulus and measure files. The invention provides a text editor that provides syntax color highlighting for the following file types:

Verilog-AMS files (suffix .v or .va)
Spice files (suffix .ckt)
Perl script files (suffix .pl)

Figure 28:
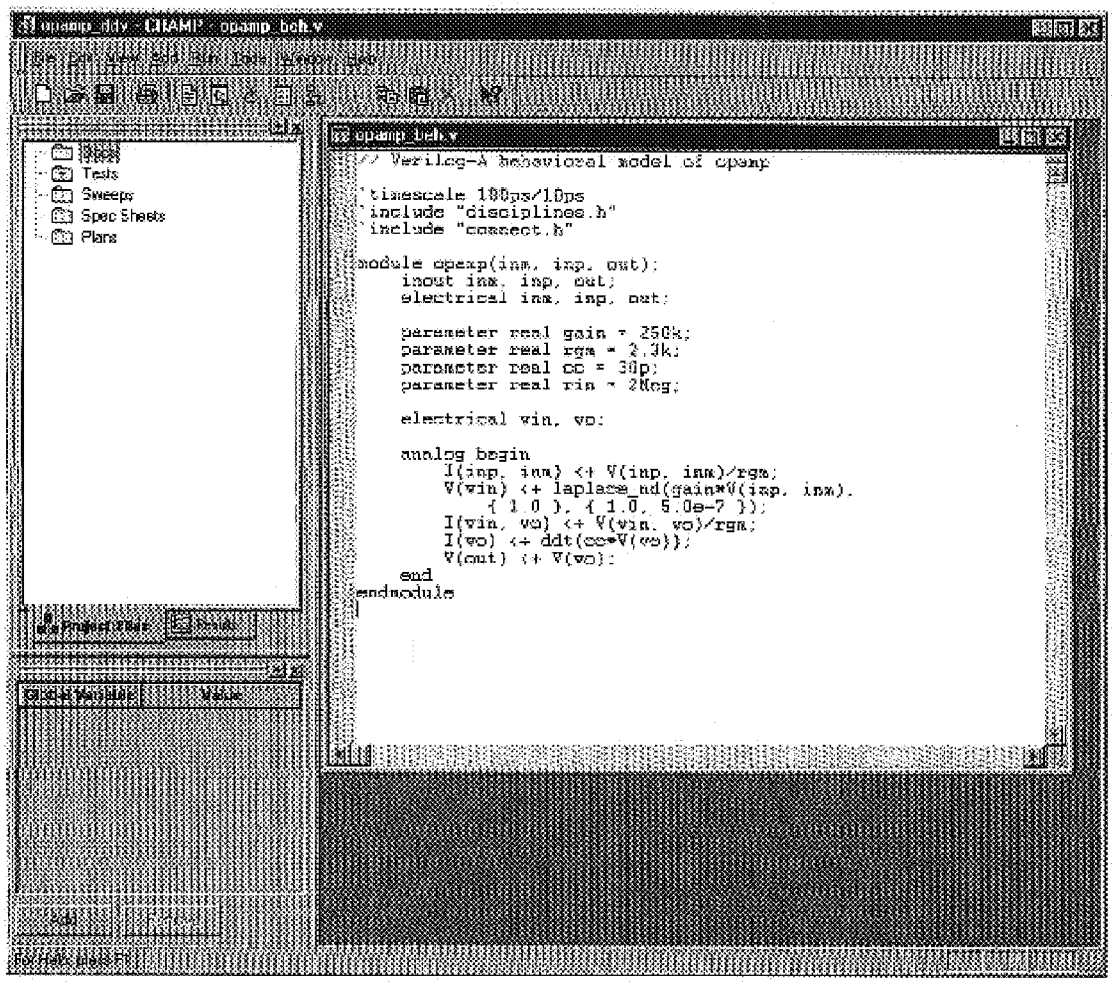
Figure 29:
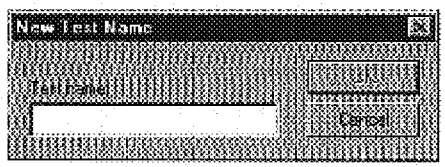
Figure 30:
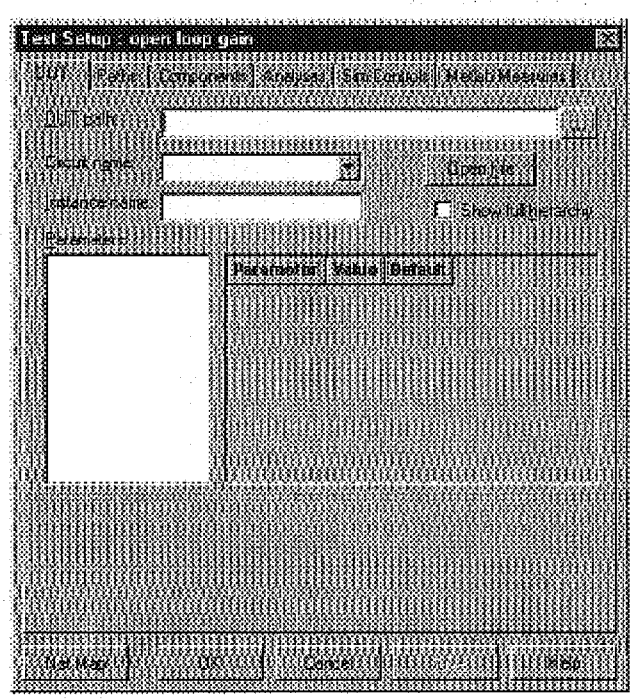

FIG. 28 shows a screenshot of a system using the invention while the user is creating a behavioral model for an op-amp Test Creation The user can create a new test using the Add/New Test top-level menu pick, or by picking the New Test toolbar button, or by choosing the New Test menu item in the context menu that is shown by right clicking on the Tests item in the Project Files area. A dialog such as shown in FIG. 29 allows them to enter a test name. Once a name is entered (for example, "open loop gain") FIG. 30 is shown. The Test Setup dialog contains tabs to guide the user setting up a test. Initially, all fields may be blank, but as stimuli, measures and the DUT are added, various fields are updated.

Lib/Cell/View Browser

Figure 31:
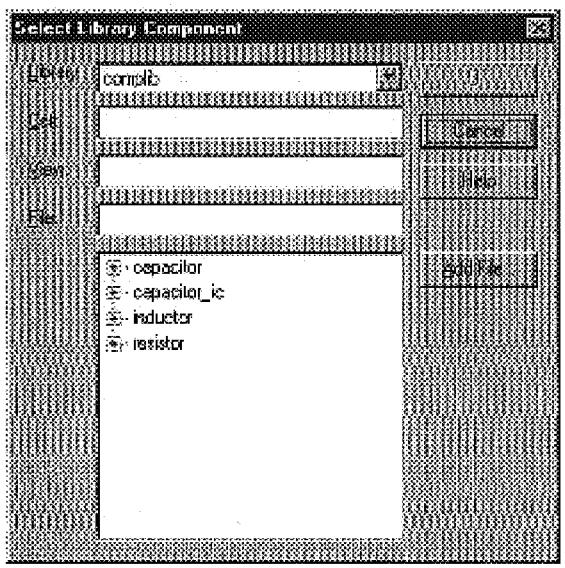

In order to encourage saving design files in a lib/cell/view organization, the invention displays a lib/cell/view browser- when the user chooses to browse for a DUT path or other design Components. A browser window appears as shown in FIG. 31

DUT Setup

Figure 32:
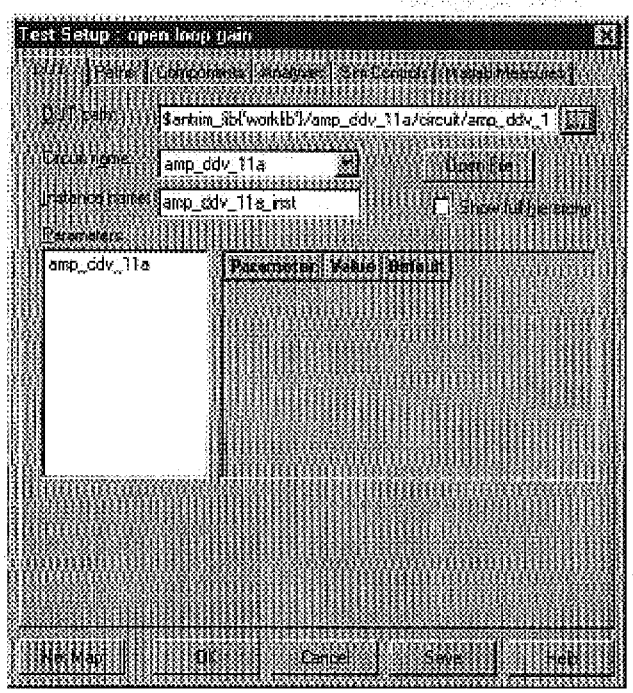
Figure 33:
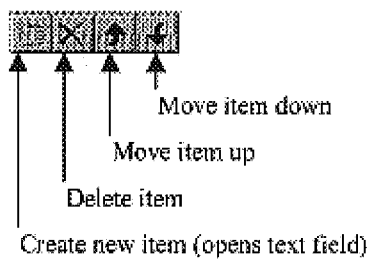
Figure 34:
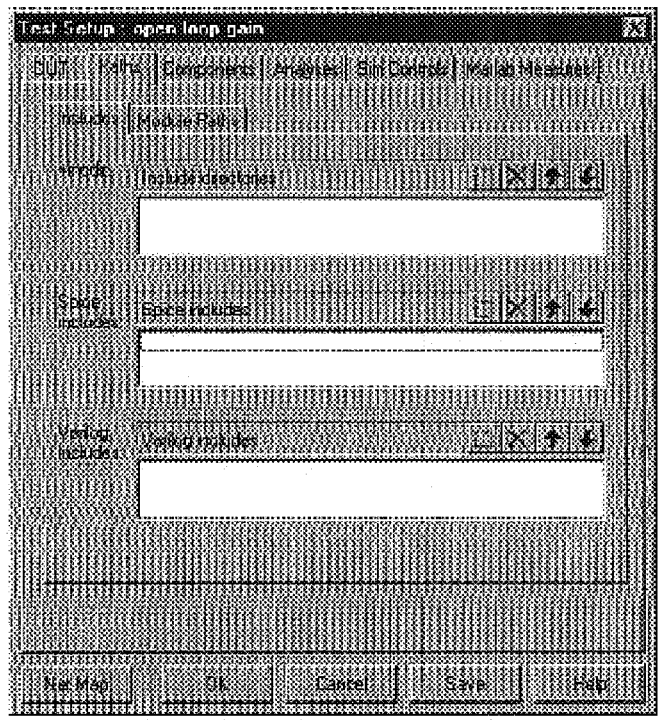
Figure 35:
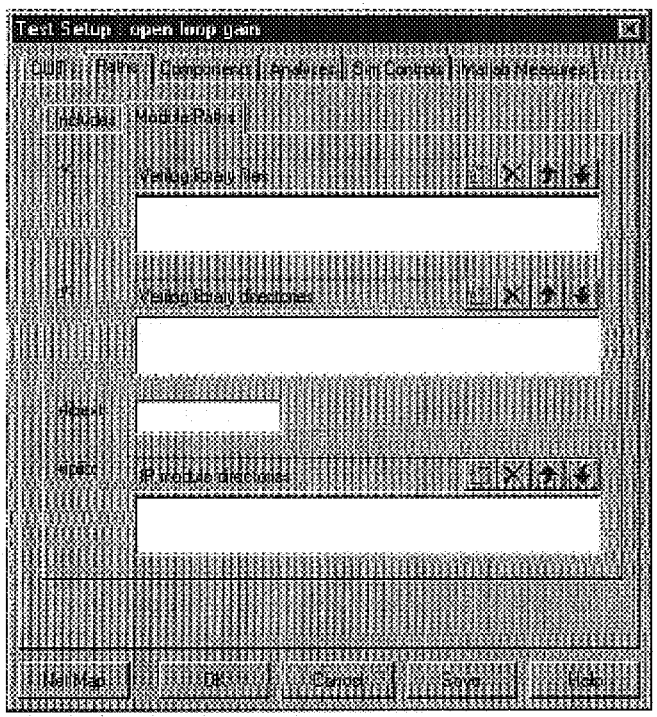

FIG. 32 shows the DUT Setup screen and includes the following options:

DUT path—The user enters the path to a DUT file (either spice or Verilog), or can select . . . (i.e. browse) and will be presented with a lib/cell/view browser. Once the DUT is chosen, it will be parsed and it's parameters and pins are added to the available set.
Circuit name—If the DUT file has more than one module or sub-circuit, the name to be used as the top-level DUT can be selected.
Instance name—Allows entry of a name to be used when the DUT is instanced in the test netlist.
Open File—Pressing this button will open a text editor that displays the contents of the DUT file.
Show full hierarchy—Normally, parameters will be set only on the top-level module. Selecting this option will display a tree-view of all sub-circuits in the design. Selecting a sub-circuit will display and allow changing of parameters for that circuit.
Parameters—Displays the parameters for the current circuit with current and default values and allows changing the value. If the user checks the Show full hierarchy checkbox, the Parameters box will become a tree display that displays all sub-circuits in the design.
Paths Setup—The Paths setup dialog has two tabs of its own: Includes and Module Paths. Items that can have a list of values have a button list like that of FIGS. 33, 34 and 35:
+incdir—Set directories for +incdir argument of AMS.
Spice includes—Spice files to be included in the generated test .v file.
Verilog includes—Verilog files to be included in the generated test .v file.
-v—Library files needed to support the DUT.
-y—Library directories needed to support the DUT.
+libext—Extension(s) to use for files in library directories.
+iplib—IP module directories.

Components Setup

Figure 36:
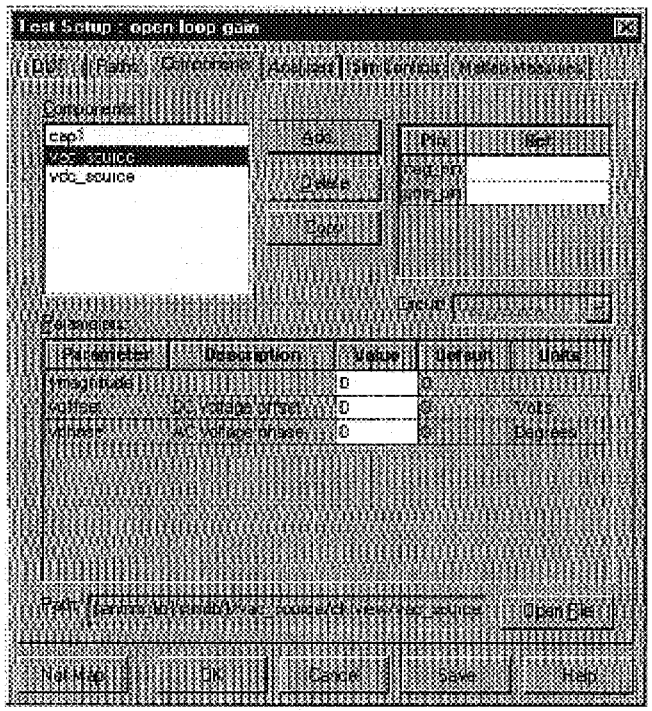
Figure 37:
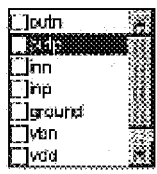

FIG. 36 shows the Components Setup screen which includes the following options.
Components—This lists the instance names of components that have been added to the test. Selecting a name fills in the other controls with the information about that component (i.e. Parameters, Path, etc.). Double clicking on a name allows editing of the component name.
Add...—Presents the lib/cell/view browser to allow selection of components using any of the following means: From a list of standard stimulus elements (currently on PWL and Staircase stimulus is supported), from any library (using libraries defined in the antrim.lm file for the project), or from any file (ending in .v, .ckt, .m, or .pl).
Delete—Deletes the selected component.
Copy—Copies the selected component to a new name.
Pin/Net—Displays the pins of the selected components and which net(s) each pin is connected to. Selecting in the Net field for a pin presents a selection list such as FIG. 37: Selecting a checkbox connects that net to the pin.
Circuit—If the component file contains more than one module or sub-circuit, the sub-circuit or module can be selected.
Parameters—This area displays the parameters and values for the component.
Path—The path to the component file.
Open File—Pressing this button will open a text editor that displays the contents of the component file.

Net Map Setup

Figure 38:
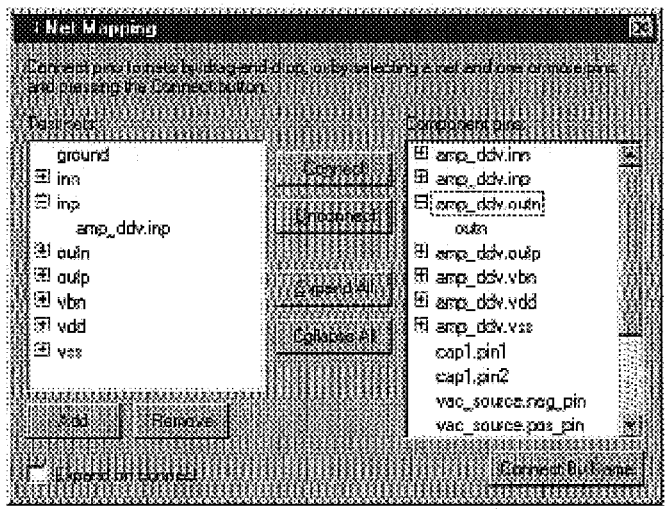
Figure 39:
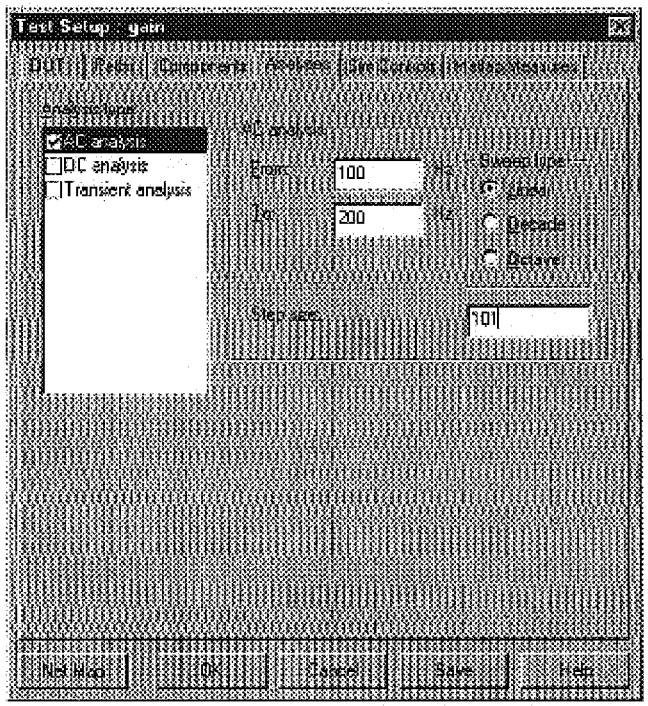
Figure 40:
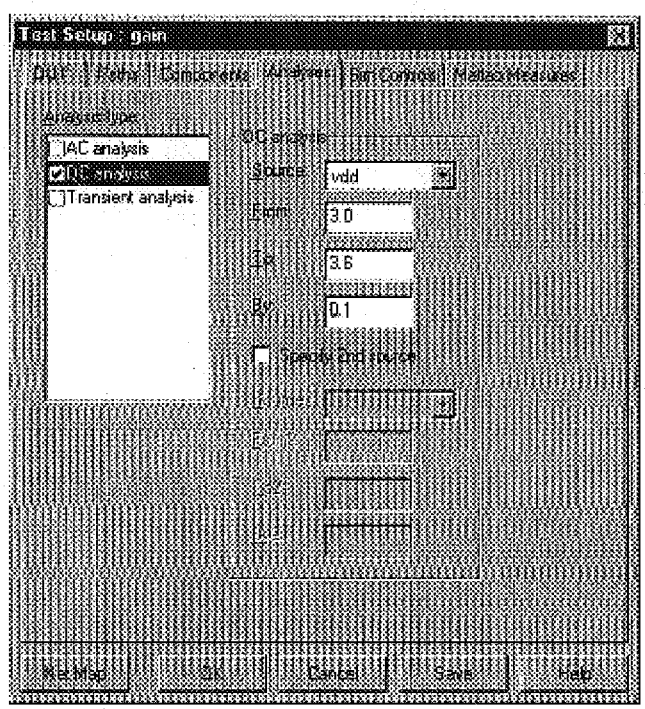
Figure 41:
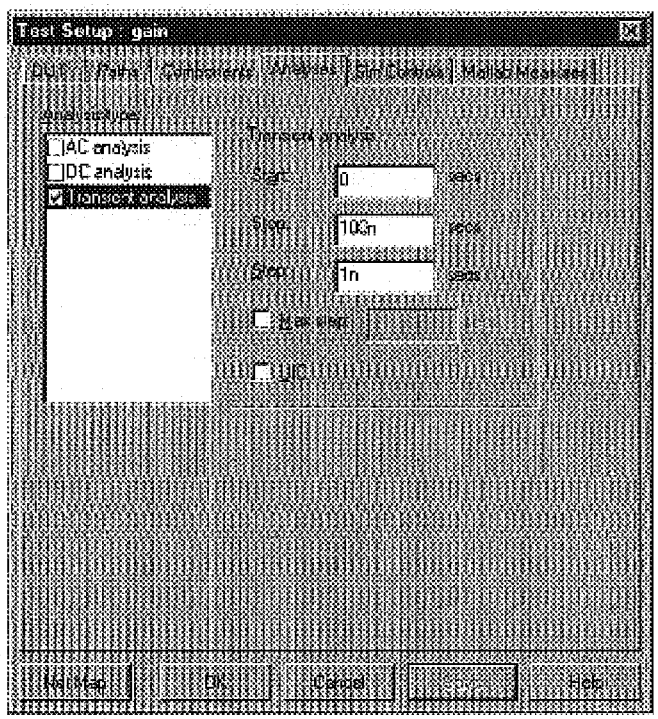
Figure 42:
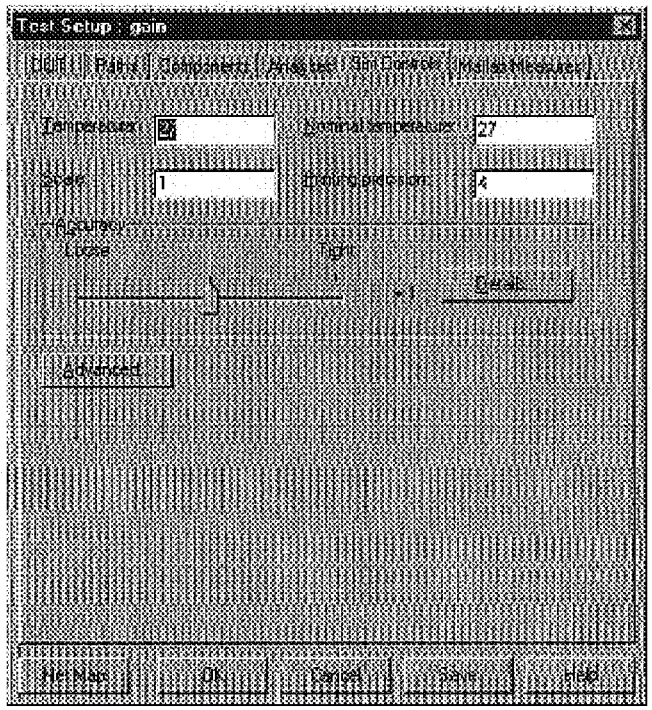
Figure 44:
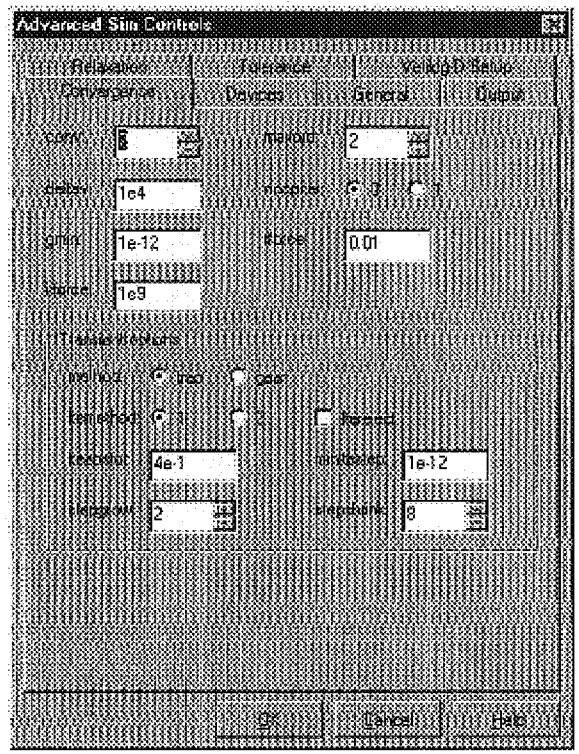
Figure 45:
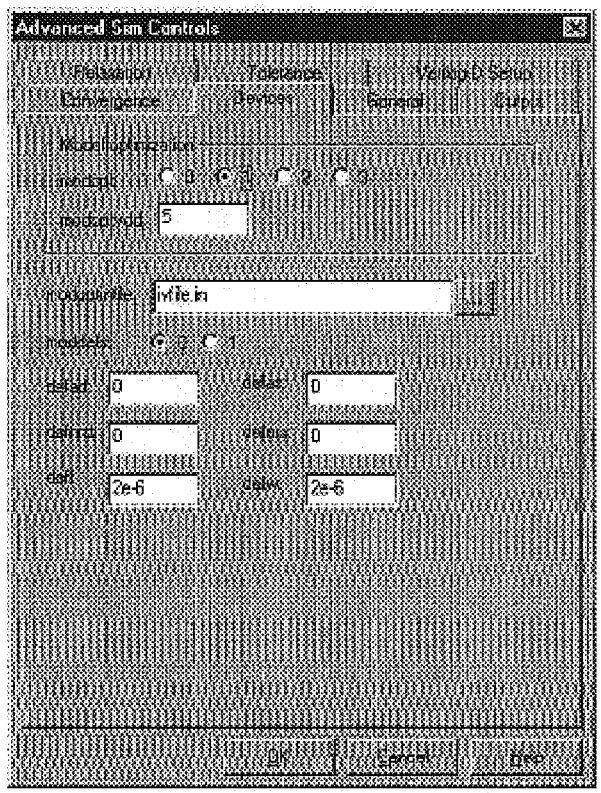
Figure 46:
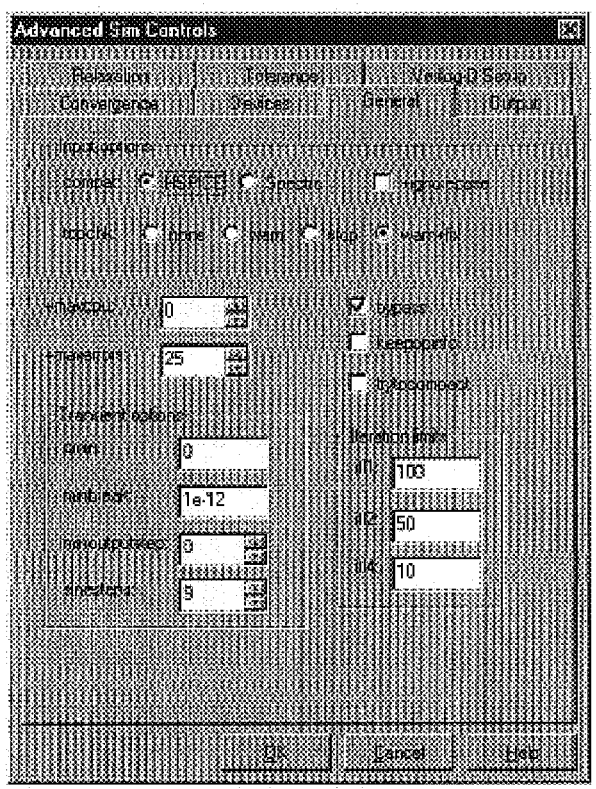
Figure 47:
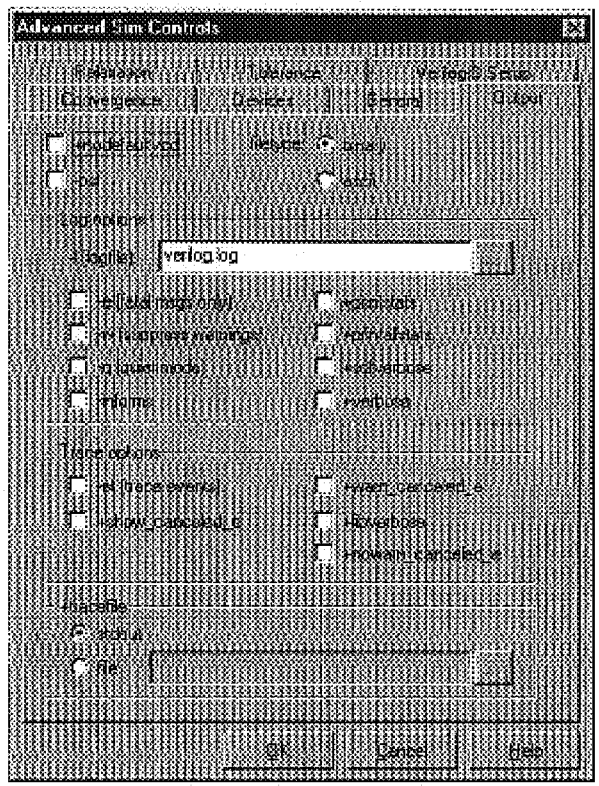
Figure 48:
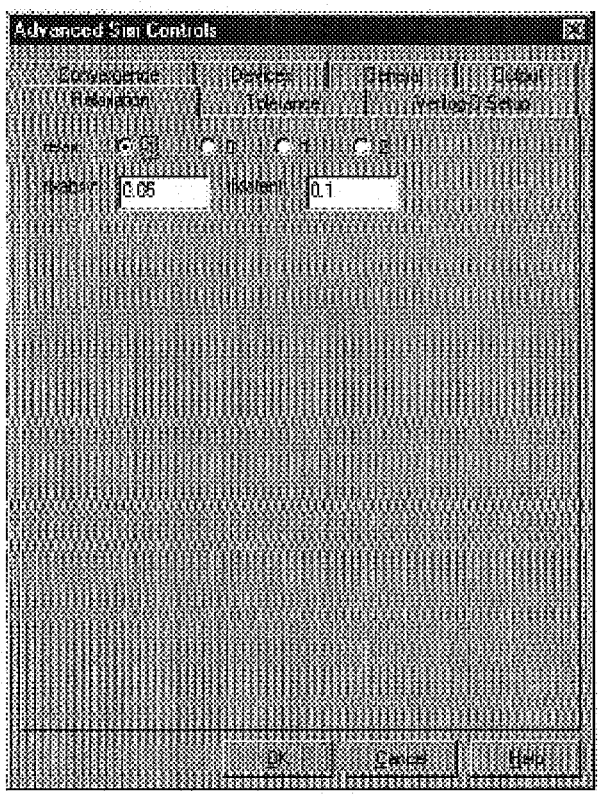
Figure 49:
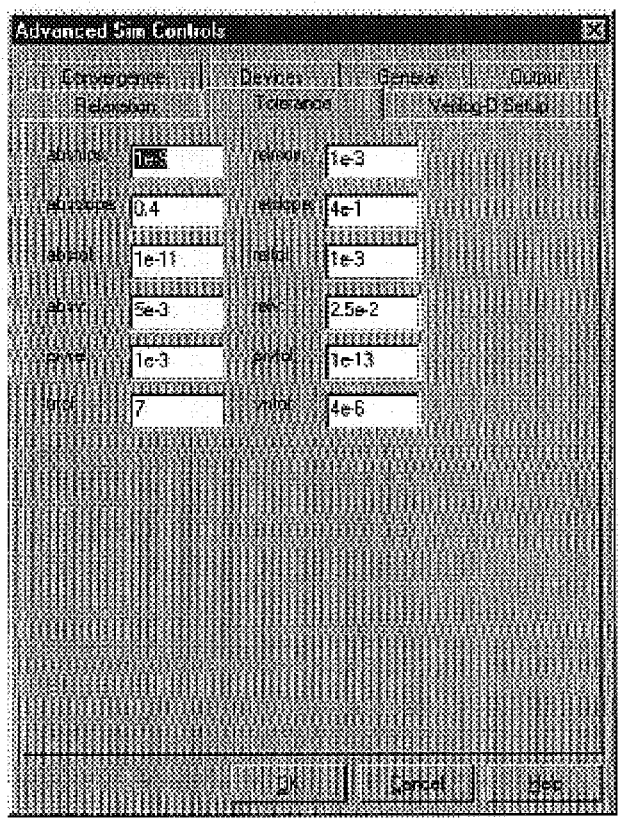
Figure 50:
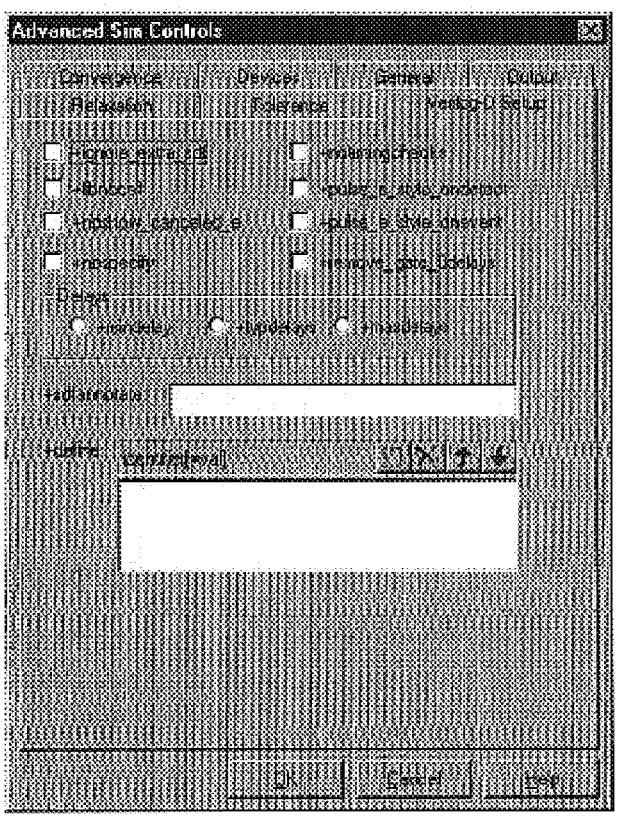
Figure 51:
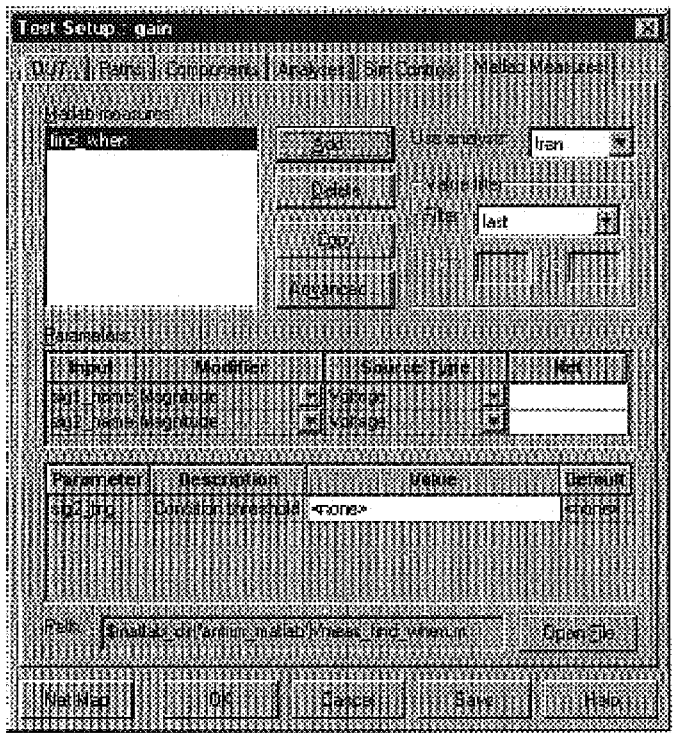

FIG. 38 shows an example of a Net Map Setup screen. When a DUT is defined for a test, the pin names of the DUT are used to create a set of Test Nets. And to start, the DUT pins are connected to the created nets. These nets are used to connect the DUT to the other components. In addition, more nets can be added, or the nets can be renamed as needed.

As components are added to the test, associated pins are added to the Component Pins list. They can then be associated with the appropriate Test Nets by drag-and-drop. The net setup screen includes the following options.

Test nets—This lists the nets for the test. New nets can be added with Add, and nets can be removed with Remove. Clicking twice on a name will present an edit box to allow the net to be renamed. Clicking + will display the components the net is connected to. Nets with no connections will not have the +.
Component pins—This lists the pins for all components. Clicking + will display the nets a pin is connected to. Pins with no connections will not have the +.
Connect—If one or more nets and pins are selected, pressing Connect will connect them if possible.
Unconnect—If one or more nets and/or pins are selected, pressing Unconnect will remove the connection if there is one.
Expand All—This expands the lists so that all connections are visible (i.e. provides the same result as if the + was clicked on all nets and pins).
Collapse All—The opposite of Expand All.
Add—Adds a new net named "NewNet" and allows editing the name.
Remove—Removes the selected net.
Expand on connect—If set, when connections are made the connections are shown as if the + was clicked on the affected nets and pins.
Connect By Name—Connects all selected pins that have the same name as a net name automatically.

Analyses Setup

The Analyses tab has a checklist box on the left side that allows an analysis to be selected or deselected. If selected, the fields become enabled and the values must be filled in.

Currently supported analyses includes AC, DC and Transient. FIGS. 39–43 shows an Analyses Setup screen, the options available therein including:

From Specifies the "fstart" parameter of the AC command.
To Specifies the "fstop" parameter of the AC command.
Sweep type Specifies the "variation" parameter of the AC command (i.e. LIN, DEC or OCT).
Step size Specifies the "n" parameter of the AC command. The Step size label actually changes based on the Sweep type selected, as follows:
Linear="Step size"
Decade="Points per decade"
Octave="Points per octave"
Source Specifies the source net. When the arrow is selected, a drop-down list is shown to allow the net to be selected.
From Specifies the "vstart" parameter of the DC command.
To Specifies the "vstop" parameter of the DC command.
By Specifies the "vincr" parameter of the DC command.
Specify $2^{nd}$ source If this is checked, the Source2/From2/To2/By2 fields are enabled to allow a $2^{nd}$ nd source to be specified.
Start Specifies the "tstart" parameter of the TRAN command.
Stop Specifies the "tstop" parameter of the TRAN command.
Step Specifies the "tstep" parameter of the TRAN command.
Max step If selected, the field is enabled to allow specification of the "tmax" parameter of the TRAN command.
UIC If selected, the UIC parameter is passed to the TRAN command.

Simulation Controls Setup

Temperature Specifies the operating temperature (temp).
Nominal temperature Specifies the nominal temperature (tnom).
Scale Scale factor for length dimensions (scale).
Accuracy Sets the accuracy from T1 (Loose) to 4 (Tight).
Details... Displays the accuracy values for all levels.
Advanced... Displays a dialog to set all other simulation parameters and flags.

Sim Controls Details Dialog

Figure 52:
Figure 53:
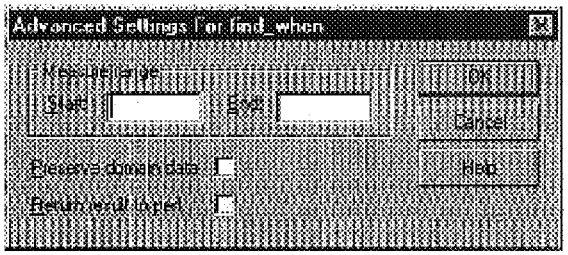
Figure 54:
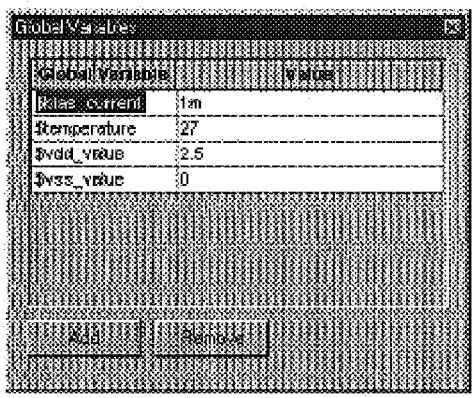
Figure 55:
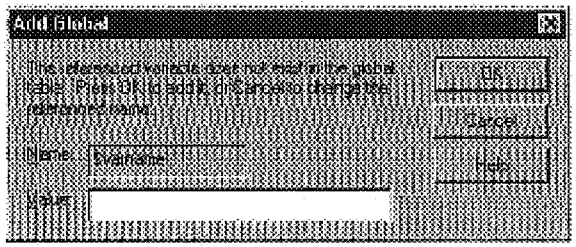
Figure 56:
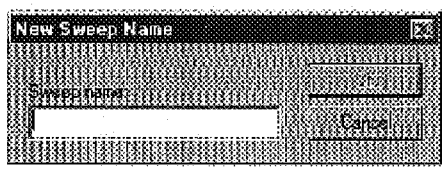
Figure 57:
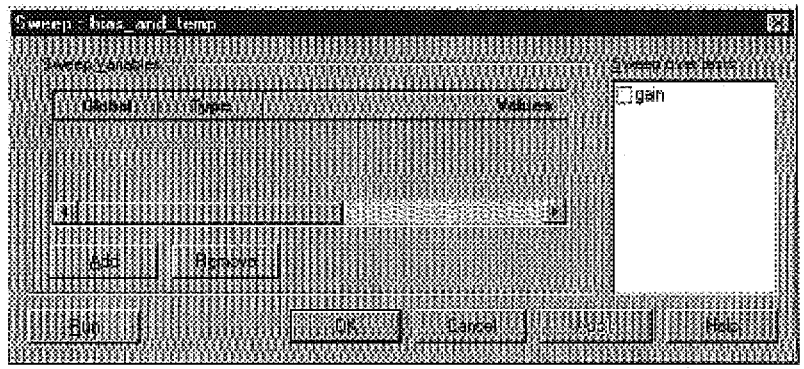
Figure 58:
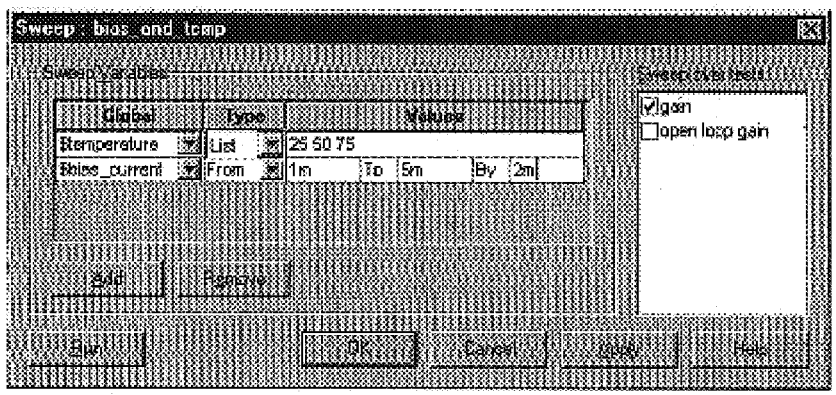
Figure 59:
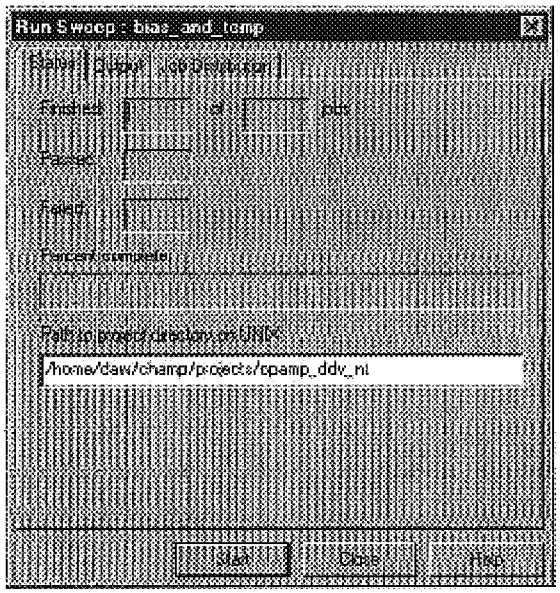
Figure 60:
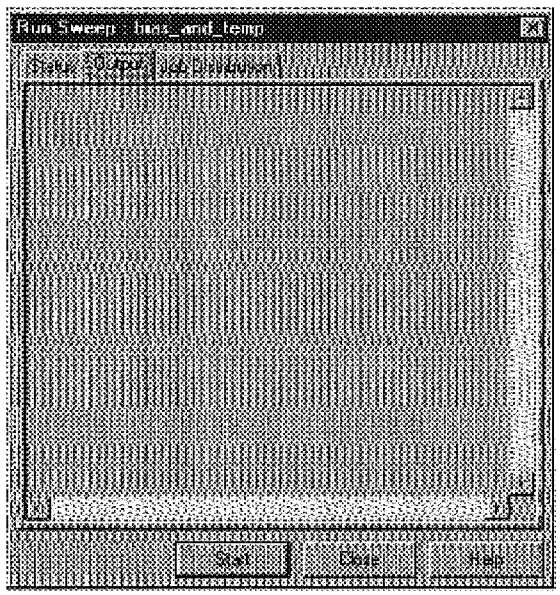
Figure 61:
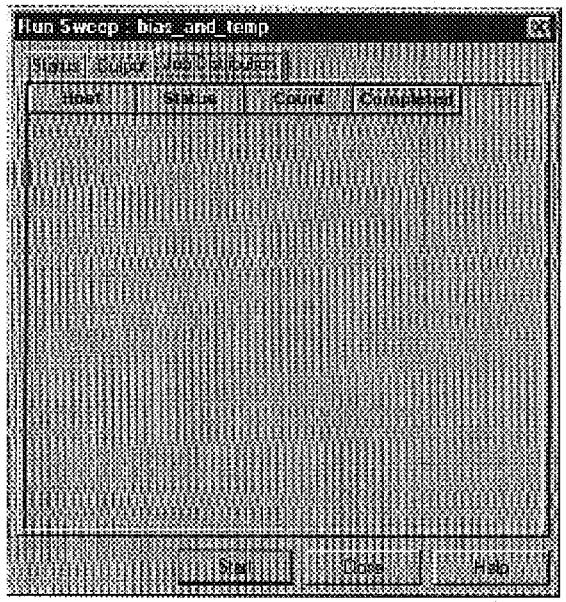

FIG. 43 displays the values used for the selected accuracy setting. Selecting a different column will change the setting.
Sim Controls Advanced Dialog The Advanced dialog allows setting of all simulation parameters and command flags. The labels for the fields have the same name as the flag or parameter to make it easy to identify options. In addition, tool tips are displayed when the cursor is moved over a field. FIGS. 44–50 show screen grabs of the dialog with each tab selected.
Measures Setup FIGS. 45–51 shows a Measures Setup screen that allows the user to list the unique names of Matlab measures that have been added to the test. Selecting a name fills in the other controls with the information about that component (i.e. Parameters, Path, etc.). Double clicking on a name allows editing of the component name.
Matlab Measures Add Dialog FIG. 52 shows a Matlab Measures Add Dialog
Matlab Measures Advanced Dialog FIG. 53 shows a Matlab Measures Advanced dialog.
Global Variables Setup FIG. 54 shows a Global Variables Setup screen. Global variables allow sharing of values between different parameters and tests. Variables can be added two ways:

When the Add button is pressed in the dialog, a new row is added. The user can type the name (must start with $) and a value.
When the user is setting values for simulation controls and component parameters, the value can be a Perl expression (i.e. contains $varname in the value). If this $varname is not already contained in the global variables list, before the user can close the current dialog they will see the dialog shown in FIG. 55.
Selecting OK will add the variable to the Globals list.
Sweep Creation Much like tests, the user can create a new sweep using the Add/New Sweep top-level menu pick, or by picking the New Sweep toolbar button, or by choosing the New Sweep menu item in the context menu that is shown by right clicking on the Sweeps item in the Project Files area. The dialog shown in FIG. 56 allows them to enter a test name. Once a name is entered (for example, "bias_and_temp") the dialog shown in FIG. 57 appears. When one or more sweep variables are added (with the Add button) the dialog would look like that of FIG. 58. Options for the sweep creator include:

Global This is a drop-down list that allows selection of a global variable to be swept.
Type This defines the type of sweep. Possible values are None, List and From.
Values Displays the sweep values. It will either be a space-separated list of values, or a From/To/By range.
Add Adds a new sweep variable row.
Remove Removes the selected sweep variable row.
Sweep over tests Allows selection of the tests that should be swept. At least one test must be selected before a sweep can be run.
Run Presents the run sweep dialog (see next section). Run Sweep Dialog This dialog runs the simulation jobs defined by the sweeps. The three tabs as shown in FIGS. 59–61 provide different levels of detail about the job status. The Status tab displays the overall progress along with a progress meter. The Output tab allows viewing of the output files. The Job Distribution tab allows viewing of which jobs are running on which machines. To start the simulation, the Start button is pressed. Once the simulation has begun, the Start button changes to a Stop button. Pressing it will cancel the simulation job.

Finished Displays how many jobs have finished and the total number of jobs being run.
Passed The number of jobs that have passed.
Failed The number of jobs that failed.
Percent complete A progress bar to display the percent complete.

This area displays the standard output of the simulation jobs.
Viewing Results

Figure 62:
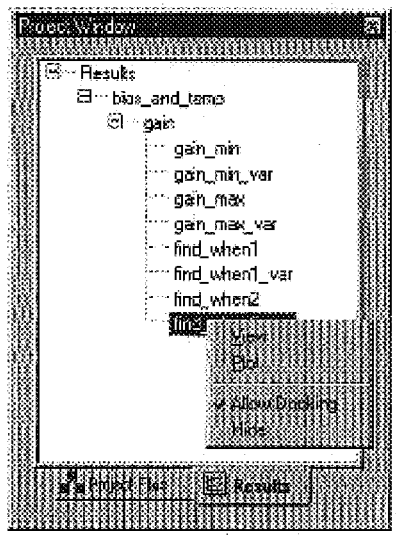

When tests are run, results are saved in the result database. Results are organized in a hierarchy based on the sweep name, the test name, and the measure name. FIG. 62 shows an expanded tree for a bias_and_temp sweep that had several measures:
The user can view the simulation results in several ways:
See the sweep measure results in a spreadsheet organization.
View the waveforms for a particular simulation job.
View 2D and 3D plots of the results.
These views can be seen by selecting the Run/View Results or Run/Plot Results top-level menu pick, or by using the context sensitive menu (shown above).

Spreadsheet Result View

Figure 63:
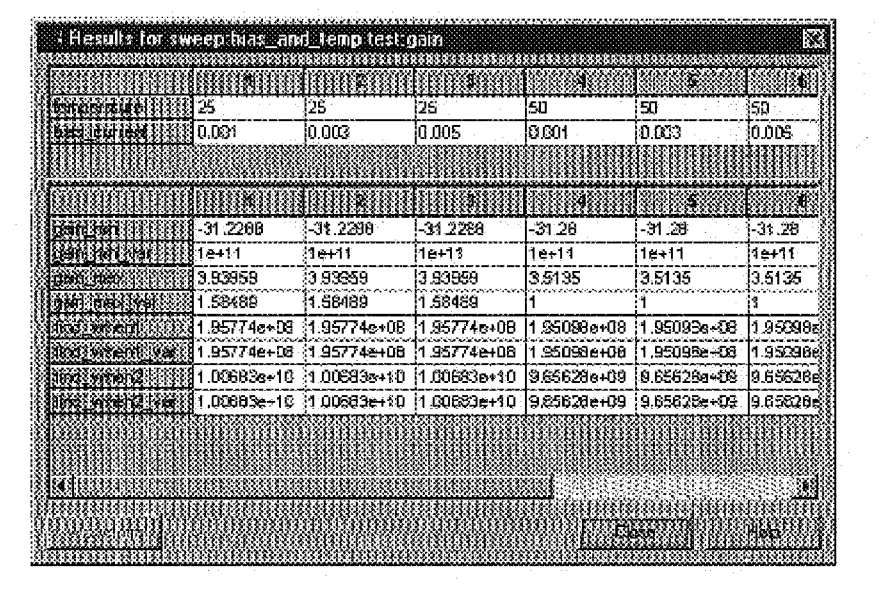

The spreadsheet result view as shown in FIG. 63 displays a column for each unique simulation job. The top section displays the swept variables and their value. The bottom section displays each measure and the value. To view the waveform for a particular simulation job, the user selects a column and presses the Waveform button.

Plot Result View

Figure 64:
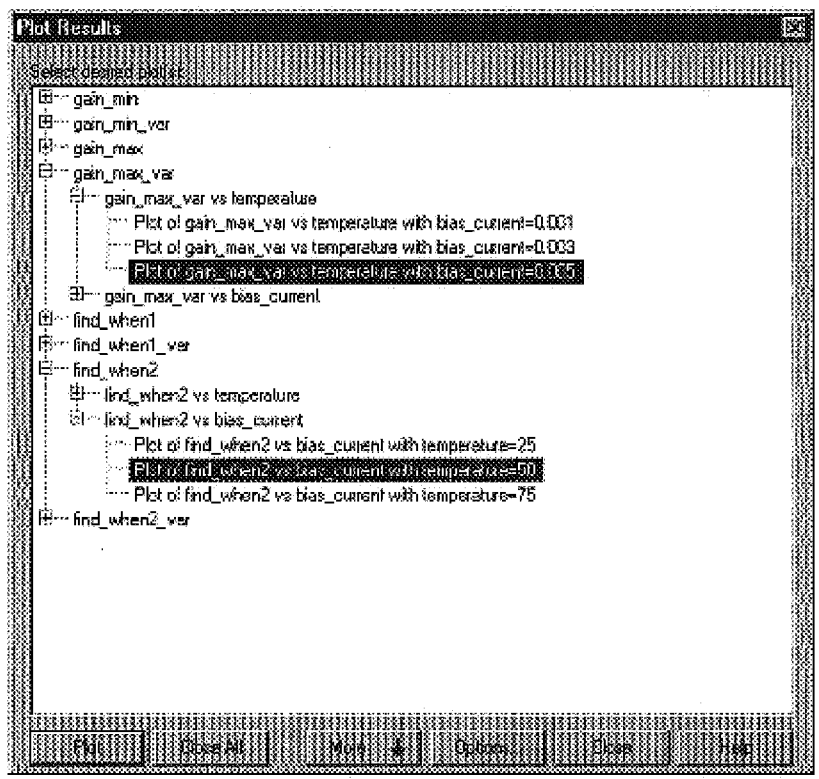

The plot result view as shown in FIG. 64 processes the result data and displays a tree of all the possible plots. The user selects one or more items in the tree and presses the Plot button to view the plots. If more than one item is selected, a single overlaid plot will be generated.

Expanded Plot Result View

Figure 65:
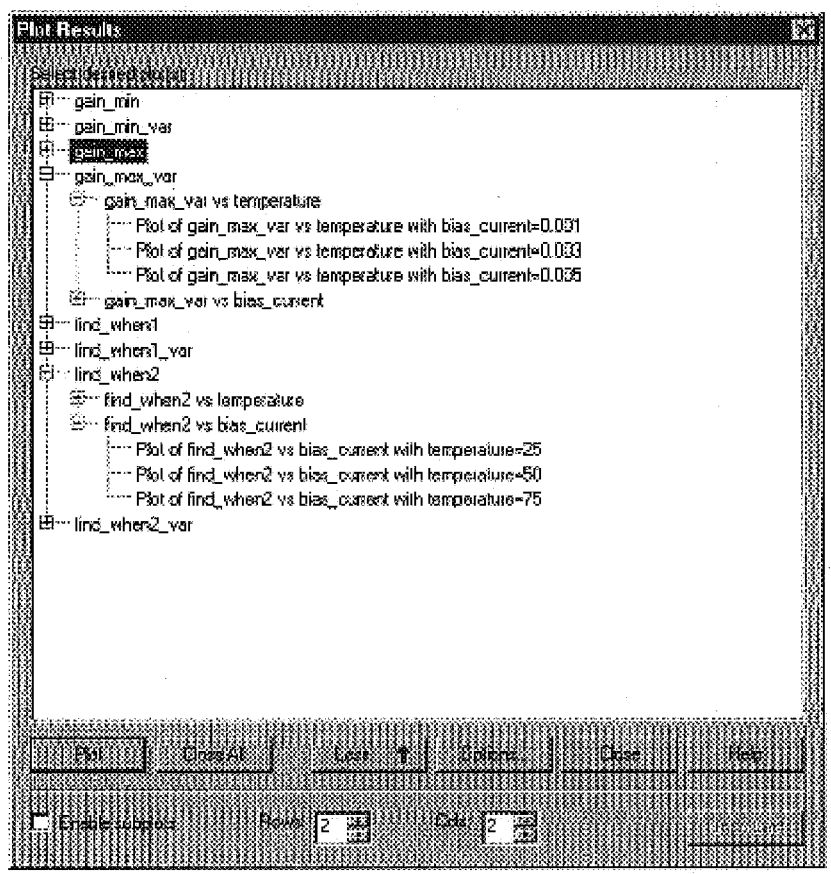

The plot window may be expanded to reveal more controls as shown in FIG. 65.

Plot Options Dialog

Figure 66:
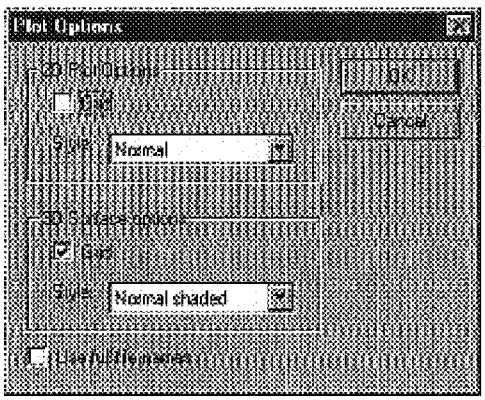

FIG. 66 shows a Plot Options dialog

Plot Windows

Figure 67:
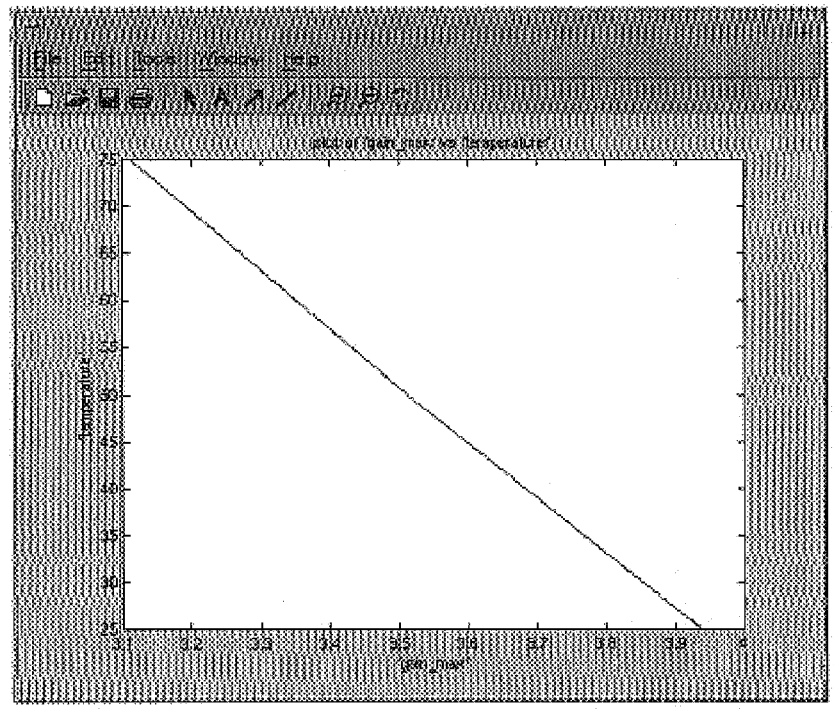
Figure 68:
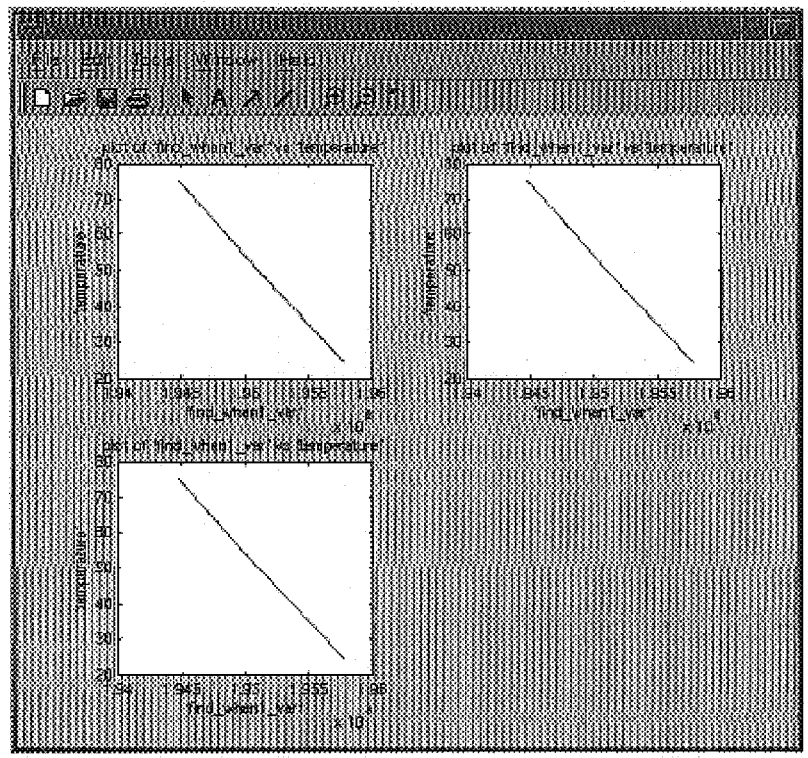
Figure 69:
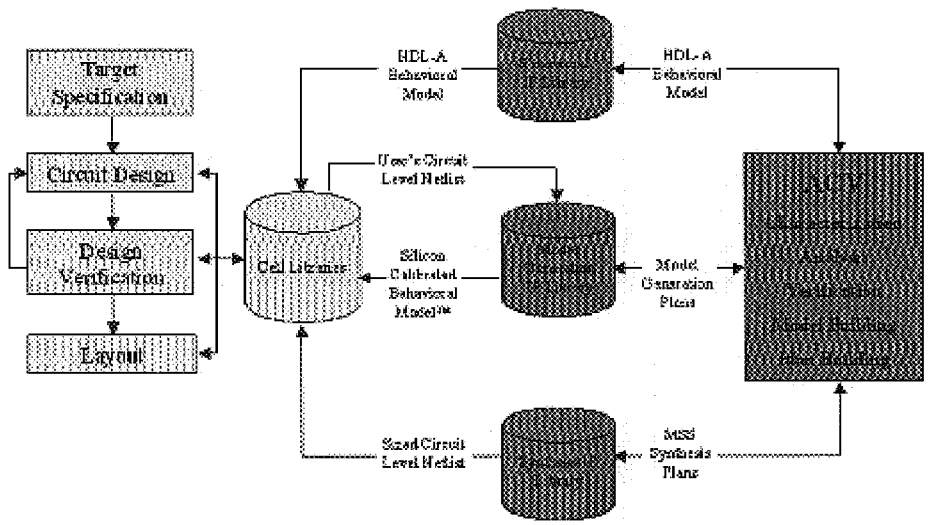
Figure 70:
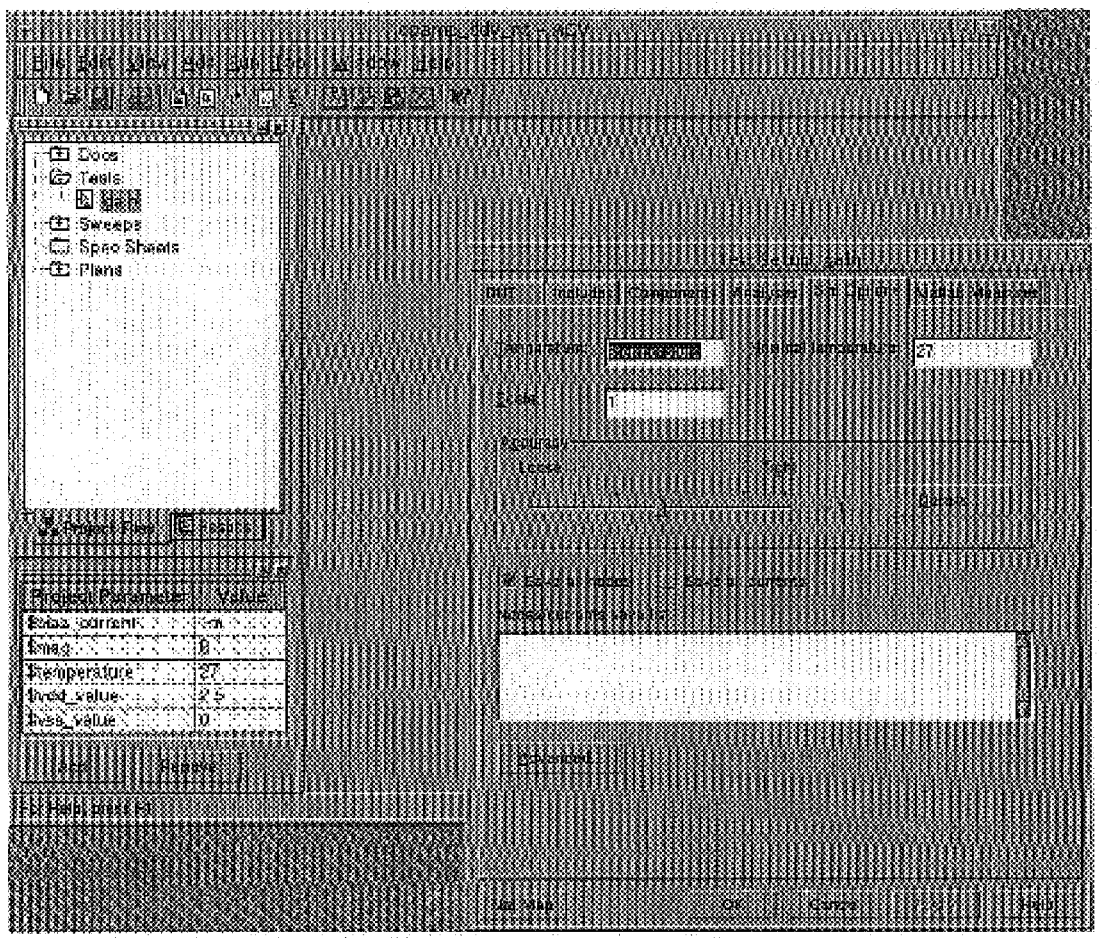
Figure 71:
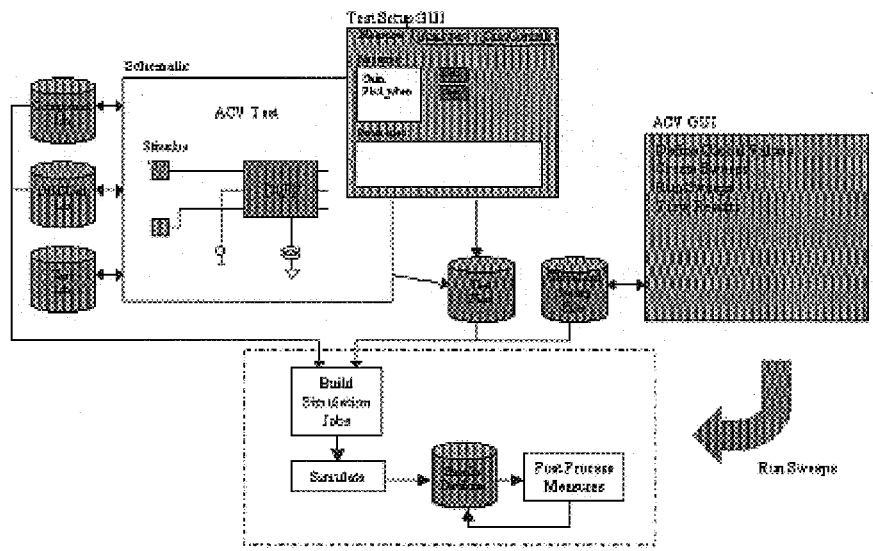
Figure 72:
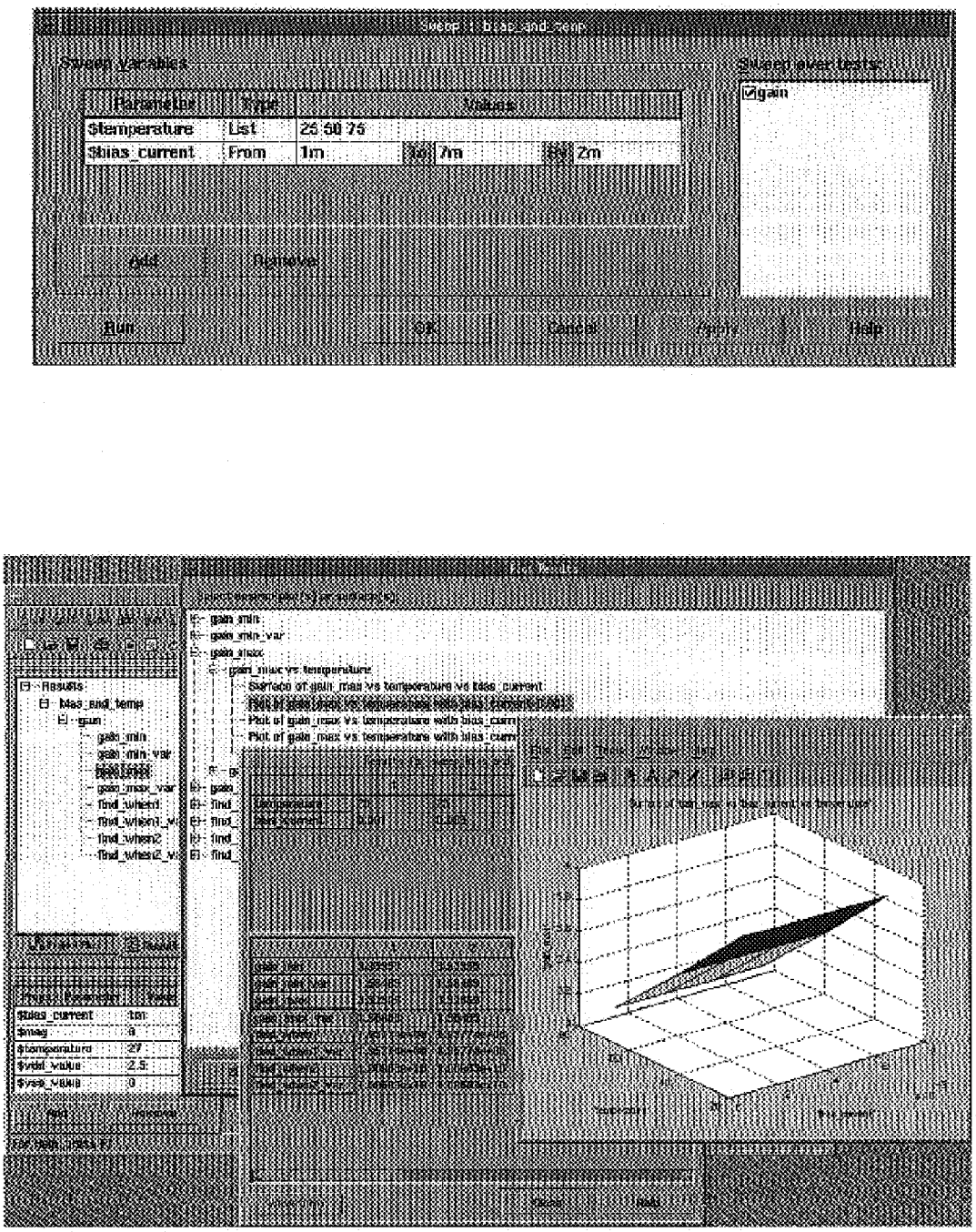
Figure 74:
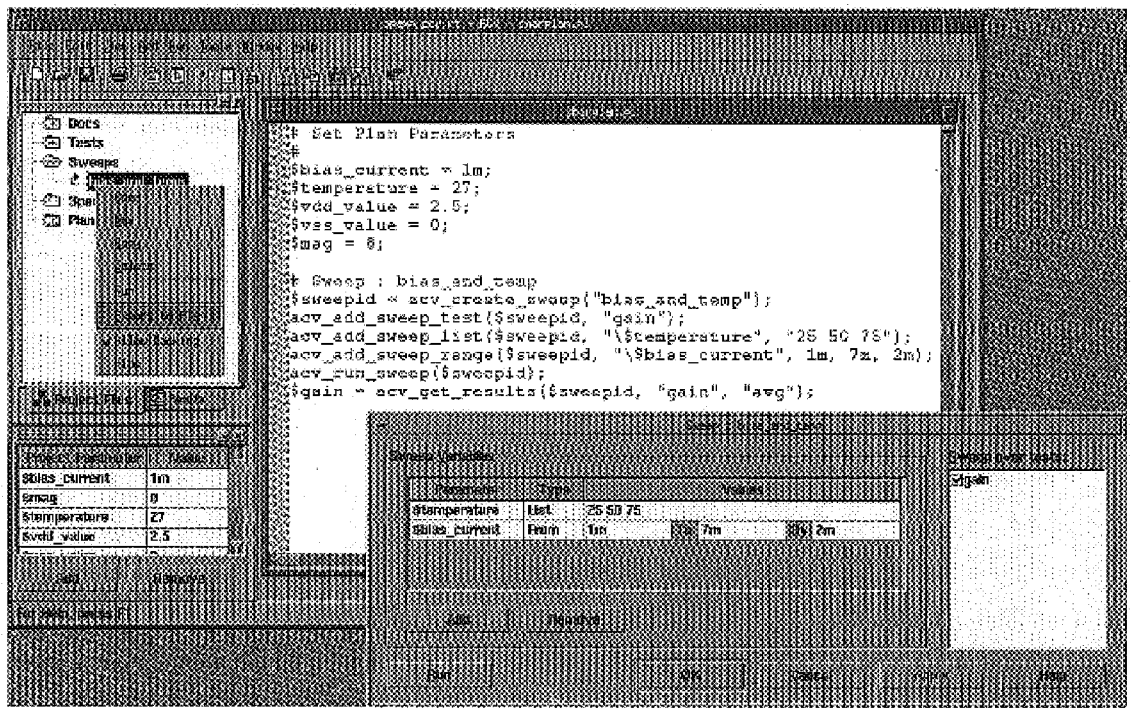

FIGS. 67 and 68 show screen shots of plot windows.

Integration with Other Systems

The majority of Analog and Mixed-Signal designers work from schematic. Therefore a good integration of the development environment provided by the invention into a schematic design system such as Composer is included.

Use Model

The Use Model is as follows:

Create a schematic containing an instance of the DUT and the Test Harness.

Start the development environment from Composer and fill out the simulation commands and measures using the environment provided by the invention.

Save the simulation commands and measures to a test using the development environment.

Netlist the schematic. This step will also save the path to the DUT, the stimulus and other components in the used by the invention format.

Create a test within the development environment which will merge the simulation control information saved by Champ with the netlist information saved by the netlister.

Start the main the invention application to run the test.

Schematic Requirements

To use the system provided by the invention with a Composer schematic, that schematic must contain an instance of the DUT (a hierarchical block). The DUT must be hierarchical with the symbol of the DUT on the top schematic page.

Test Harness

The test harness can consist of:

Stimulus

Any other needed components such as a resistor to model load.

All appropriate connections (nets) so that the DUT plus harness is capable of being simulated.

It is possible that the schematic might have more than one block or may contain no blocks.

Integration

There are two possible ways in which to start the system environment from within Composer:

MPS ipcSkillProcess (or ipcBeginProcess)

The preferred method is MPS, since MPS allows more interaction between the parent and child process.

The ipcSkillProcess routine may also be used as follows:

Composer starts the development environment with ipcSkillProcess.

The environment contains some button (for example) to Select from Schematic.

The code behind this button sends back a Skill procedure call to Composer.

That procedure grabs the selected net or instance and passes it back to the development environment.

GUI

An environment system Pull-down menu may be added to the main Composerwindow. The pull-down contains the following items:

Setup Analyses...

Setup Simulation Control...

Setup Measures...

Create Netlist

Create Test

Run Champ...

Analyses/Sim Control/Measures

The development environment application consists of the following main tabs:

Analyses

Sim Control

Measures

Stimuli

Components

Pin Map

Analyses, Sim Control and Measures are easily accessible from the Composer window. Stimuli, Components and Pin Map are not needed because they are in the schematic and do not need to be entered in text form. If they need to be modified, they can be edited on the schematic. When Analyses is chosen, the form will come up with the Analyses tab selected. When Sim Control is selected the form will be displayed with the Sim Control tab selected, and so on. Once displayed, a designer can interact with the development environment in the same manner as if they had brought up the environment within Unix. It is the same form with the same use model.

After filling out the analysis, sim control and measures the designer may save the test using the normal mechanism to do this in the development environment. This will save everything the designer filled out into a development test file. At this point the DUT, the stimulus and other components will not be in the test file as they were not filled out in the GUI.

Measures

Measures typically act upon the schematic (or netlist), either the nets or the instances. When selecting Measures it may be useful to select the desired net or instance from the schematic. If select from schematic into the development environment is not possible in the given time frame then the user will need to type in the net or instance name. If a net or instance name is mapped during netlisting, the original (and now, incorrect name) will be in the Measure. A solution to this problem is to use OSS' simInWithArgs syntax. When creating the test, the development system will need to write Measures using the OSS 'simInWithArgs' syntax around net and inst names. The netlister then reads in this test file to do the appropriate name substitution.

Netlist

When the Netlist option is chosen, a dialogue appears asking the user where the netlist of the DUT should be stored. The default location is in the lib/cell/view, i.e., a view type will be created in the lib/cell/view. The Composer netlister will then netlist the design, writing the DUT to a separate file, and the components (stimulus or other) to another file. At the same time, the netlister will create the required test file by writing the path to the DUT netlist, the stimulus and the components to a test.sch file. This file will be written to the project dir, which is the current dir. The format of a test file is as follows:

```
DUT instance_name {
    PATH = path to .v or .ckt file <-- path may be given as:
        $libname/cellname/viewname/filename ($ is special char)
        or  relative path (relative to project directory)
        or  full path (begins with / or x:/)
    TYPE = VER | CKT
    DESIGN_NAME = name
    PARAMS {
        Instance_path = value
    }
    SHOW_ALL = 1 | 0
    SPICE_INC = path to spice include file <-- may be more than one.
    VER_INC = path to verilog file
}
COMPONENT instance_name {
    PATH = path to .v or .ckt file <-- as with DUT
    COMPONENT_NAME = module name
    TYPE = VER | CKT | M | PL
        CLASS = STIM | MEAS | COMP | OTHER | PWL_DIG |
    PWL_ANALOG | STAIR
    PARAMS{
        name = value
    }
}
PIN_MAP{
    Instance_name.pinname = instance_name.pinname
}
```

However, all the above information is not available in Composer. Therefore the netlister will write the following information:

```
DUT instance_name {
    PATH = path to where the DUT netlist was saved
    TYPE =VER | CKT
    DESIGN_NAME = name of the DUT
    PARAMS{
        Instance_path = value
    }
    SHOW_ALL = 0
}
COMPONENT instance_name {
    PATH = path to that particular component's netlist file.
    COMPONENT_NAME = module name
    TYPE = VER | CKT | Measure | Perl
        CLASS = STIM | MEAS | COMP | OTHER | PWL_DIG |
    PWL_ANALOG | STAIR
    PARAMS {
        name = value
    }
}
PIN_MAP{
    Instance_name.pinname = instance_name.pinname
}
```

And the invention will be additionally responsible for writing the remainder, which is:

```
DUT instance_name {
    SPICE_INC = path to spice include file <-- may be more than one.
    VER_INC = path to verilog file
}
```

It is important for the DUT to be separated from the test harness for the development environment. Therefore, as specified in the section on schematics, there should be one block on the schematic and that one block should be the DUT. However, this may not be the case. The following describes the action if there is more than one block or no blocks on the schematic:

One block—The netlister will assume this is the DUT.
More than one block—The netlister will look for a 'DUT' property.
One block has the DUT property set—This is the DUT.
No block has the DUT property set—Bring up a form asking the designer to click on the DUT.—More than one block has the DUT property set.
Issue an error
No blocks—Issue an error Create Test After netlisting and filling out the simulation commands a full test can be created. This step simply merges the two test files created by the development system and the netlister into one test. This test can then be run from within the development environment.

Start Champ

The Run choice brings up the entire GUI. At this point the designer can run the test or else perform any other aspect of the invention.

Spec Sheet Verification Tool

In the Verification Phase of design, the circuit is functional and the designer now wants to run his design through a number of predefined tests. This phase of the design is almost always run as a batch process; a variety of simulations are run and the designer inspects the results when they are finished. Longer more extensive simulations such as Corners, Monte Carlo, and Parametric Analysis may be run at this stage. After running all the tests a designer has the time (or requirement) to run he/she collects all the data and enters it into a spec sheet to present in a design review.

Gathering this data is often a tedious time-consuming process of inspecting one result after the other and manually typing in results into some editing tool such as Excel or Framemaker. Additionally it is often difficult to find, understand and organize the large volume of data returned from all the tests.

Providing designers with an easy way to accomplish this task is very important. The purpose of the Verification project in the invention is to do just that. The purpose is to create a spec-sheet like GUI to:

Allow the creation of the spec sheet in Champ for design reviews.
Manage and Organize the data coming back from a single or multiple analyses.
Report a Pass/Fail condition for measurements and provide means for further inspection of the data.

In addition to the above goals, equally important is the verification of:

A behavioral model against the circuit design
A circuit design against another circuit design.
A behavioral model against another behavioral model.

In other words, not only does this GUI serve to verify a design against a set of required results, but also to verify a design (behavioral or circuit) against another design (behavioral or circuit).

GUI

The Spec Sheet Verification tool is part of the system and therefore uses the same main setup as all the other tools.

There are three views of the Spec Sheet Verification tool:
Analysis
Sweep
Comparison The three views are quite similar with a few differences. The following sections will show the three views and then explain the functionality of each view.

Analysis

The GUI of FIG. 75 shows the default spec sheet for an analysis, for example, a single transient analysis.

Sweep

The GUI of FIG. 76 shows the default spec sheet for multiple analyses (sweeps):

Comparison

When comparing a design/behavioral model against another design/behavioral model, the default spec sheet section is slightly modified again to resemble that of FIG. 77.

Use Model 1: Data Display—In this use model the simulations and sweeps are setup and run in the development application, as usual. In the Spec Sheet GUI a user determines which test and which measurements of that test he is interested in examining. He/she also enters the Min spec, Max spec, or Verification Tolerance and Tolerance Value choices. The spec sheet then fills out the Conditions and Values, does the appropriate comparisons and determines the Pass/Fail status. In this use model the spec sheet simply displays simulation data and does some comparison calculations on that data.

Use Model 2: Data Display and Reduction—The same capabilities of the first use model apply to this one as well. In addition, a user can modify the Conditions by choosing a subset of the data available. For example, if a set of simulations were run from vcc=0 to 5 by 1, the user can choose to only display data for vcc=2 and 5.

Use Model 3: Display and Run—The last use model provides all the functionality of the first two. In addition, simulations can be driven from the Spec Sheet. If Conditions are entered that have not been run, as opposed to possibly printing an error message that the data is not available, the simulations will run to create the desired data.

General Features

The following sections describe the functionality of the GUI.

Save/Print

From the development environment a user may Save information, Print it, or close the application. As with any tool in the Spec Sheet Verification Tool will use these same dialogues to save, print or close.

Design

Design is the name of the design for which the data is being compared. If a design is compared against another design, both names will appear.

Test Name

The Test Name (in the left most column in the picture of the GUI) is the name of the test. This may consist of a analysis: tran or it may be a multiple analyses, a Sweep or Corners for example. Any test may have one or more measurements associated with it. The spec sheet could contain any number of tests and each could have been created using different setups or schematics. The test name will be entered by the designer. A context sensitive menu may allow a user to select a test name from those tests available in the project.

Measurement

The measurement can be any measurement available in the system. Tests will typically already contain measurements. A user may extract the measurement from the test and place them automatically in the Spec Sheet GUI (giving users the means to delete a measurement, if not wanted). In addition a user may build a measurement in the system and then import that measurement into the Spec Sheet. A user may also type in a measurement, if desired.

Condition

The Condition column shows the setting of all the global design variables in that test. For the analysis, this is simply the value of the global variables fort hat one run. For sweep or comparison, this field shows all the values for which that row in the spec sheet applies. For example, for the analysis shown above, the Tran1 test was run with the one global variable Vcc set to 1. For the sweep example shown above, the Temp-Volt test was run with Vcc values: 1, 2, 3, 4, and 5 and temp values of −55, 0, 27 and 55. Process and Model parameters are not shown in the Condition column. There could be hundreds (or thousands) of Process or Model parameters. Typically there will be less than 10 design variables. However, even if there are more, they should all be shown to understand under what conditions the results were obtained.

The Conditions (global design variables, model types (for Corners)) need to be extracted from the test. A user may specify a subset or all of the conditions.

Min/Max/Tolerance

The Min/Max columns for the three views differ based on the information that is to be compared.

Analysis

The Min spec and Max spec columns can be used to enter the minimum acceptable value and the maximum acceptable value. If the computed value is within this range, the measurement has passed. If it is less than Min spec or greater than Max spec, the measurement failed. Both settings are optional. If Min is not specified, then the value need only be less than the Max spec to pass. Likewise if Max is not specified, the value need only be greater than the Min spec to pass. If neither are specified then a Pass/Fail criteria can not be assigned to the measurement. Value is the computed value, the result of the measurement for that test.

The above explains the simplest (and for the most case, typical) use of Min Spec/Max Spec/Value. It is possible that a run could produce an array of values as opposed to one value. In this case, Min Spec/Max Spec not only need to accept a single number, but also an array of numbers or an equation. The system may let the user know what kind of data was returned and therefore what kind of data needs to be filled in for the comparison.

Sweep

As with Analysis, the Min spec and Max spec columns can be used to enter the minimum acceptable value and the maximum acceptable value (or array or equation). Min Value is the minimum value of all the simulations for that measurement and Max value will be the maximum. (Example: If there are 5 Corners, and the result of the riseTime measurement for each Corner is: 1N, 1N, 3N, 1N and 2N, then Min Value will be 1N and Max Value will be 3N.) If Min Spec<Min Value and Max Value<Max Spec, the measurement passed, otherwise failed.

Comparison

If the results of a design (circuit or behavioral) are compared against the results of another design (circuit or behavioral) then the comparison becomes more complicated. Instead of checking if any value (of all the values) exceeds a spec, each result for each run of the first design can be compared with each result of each run of the second design. First the method by which the results will be compared must be specified in the Verification Tolerance column. The choices for this column will be described in the section on Verification Tolerances.

The Min Comp column is the minimum value after comparing each result from each run from the first design with each result from each run from the second design. For example, suppose two designs are being compared and for various values of some global parameter, the following results are obtained. Assume the verification tolerance is 'absolute', and the Tolerance Value is 2n. This means the result passed if $$|(Design2-Design1)|<2n.$$

| Vcc | Design1 | Design2 |
|---|---|---|
| 1 | 1n | 2n |
| 2 | 2n | 4n |
| 3 | 1n | 1n |

In this case, Min Comp is 0, Max Comp is 2n, and Pass/Fail would show Pass, because the Max Comp is less than (or equal to) the required 2n.

Pass/Fail

The Pass/Fail column is used to indicate if the measurement passed or failed. Again, if the calculated result is within the range, as described above, a Pass will be printed, otherwise a Fail.

Plot

A primary function of the Verification project is not only to produce the spec sheet but also to present the data in an easy to use manner to help the designer determine if his/her design is functioning as required. The spec sheet GUI is quite useful with the easy Pass/Fail column. Another way to present the data is with a residual plot with "bands". The residual plot shows the min and max spec values and then shows the results plotted as a waveform. The waveform must fit inside the bands. It is easy to determine if any points are outside the range. A user may click on the points that are outside the range and tie them back to the particular run that produced them.

Figure 78:
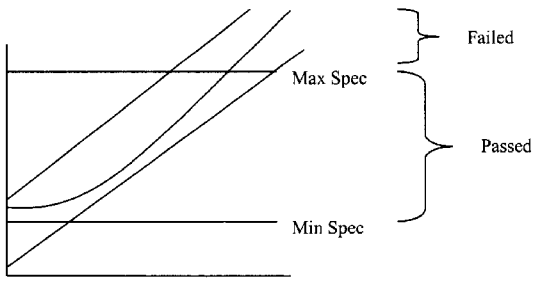

In addition to the 2D residual plot, the system may show 3D graphs of one variable vs. another and the planes of results that go out of bounds. A residual plot of the results will be shown if the Plot button is chosen. FIG. 78 shows how a plot of an Analysis may appear.

Show Design/Show Test

If a measurement fails, the designer may need to see the conditions under which the design was run. He/she will want to see the schematic (or netlist) along with the stimulus and the simulation setup (such as analyses, options, etc). Additionally, a designer will need to see more information on the results, in particular on those that failed. He may also want to see additional results for those that passed, in order to see how close they were.

Show Design

If the schematic button is on, and Composer is active, the design that was run to create the results in the spec sheet will be opened and displayed. If the spec sheet is used to compare two designs, both designs will be displayed and the new one will be current. For behavioral models, the textual representation will be displayed.

Show Test

If Show Test is chosen, the environment GUI will be loaded with all the simulation settings that were used to produce that result. The netlist will also be accessible.

Pass/Fail

If Pass/Fail is chosen the user can view the results in detail, rather than just the min and max results. For an analysis this choice won't provide any more information than what is already available in the spec sheet. For sweep, this option will provide all the results of all the individual analyses. For example, if the following Parametric Analysis was run:

```
Sweep temperature from [-50, 0, 25, 50, 125]
Sweep VDC from 1 to 5 by 1
run
)
)
```

The results from 25 runs, for each of the above temp/VDC combinations would be shown as illustrated in FIG. 79. The FAILed cases (if any) will be displayed first and the PASSed cases (if any) will be displayed last. The Pass/Fail column now shows if each individual simulation passed or failed. The Sim Success column indicates if the simulation was successful or not (perhaps failed due to missing models, etc). The Show Log column can be used to bring up the simulator's log file for that run.

Tolerances

To compare a design against spec sheet values, a simple less than, or greater than, can be done to indicate if the measurement passed or failed. If two designs are compared, the comparison is substantially more complicated. The Verification Tolerance column on the Spec Sheet allows a user to select how the results obtained from the two designs should be compared. The number in the Tolerance column is used in the comparison. The available choices are:

Note: design1=resultFromDesign1, design2= resultFromDesign2 absolute
|design1−design2|<Tolerance
percentage
|design1−design2|<Tolerance*design1
range
|design1−design2|<Tolerance*(MaxResuitFromDesign1− MinResultFromDesign1)
absolute+percentage Other methods of determining Pass/Fail may be provided.

Other Features

One of the main goals of the invention is to enable the creation of a spec sheet for design reviews. Most customers have a different set of requirements on what needs to be included in a spec sheet and how it needs to be presented. Therefore in order to meet this goal, the spec sheet GUI is site configurable. The following features are available:

Ability to add columns.
Ability to delete columns.
Ability to move columns.
Ability to modify the header labels.

Columns can be moved, deleted or modified in the same manner as in any Microsoft Application, such as MSWord. The ability to Add a Column is similar to the Add Column feature in Microsoft Project. A set of pre-defined columns can be provided with the system.

Statistical Columns

When comparing two designs, a number of statistical comparisons may be desired: Distribution, Mean, Standard Deviation, Absolute Deviation, Relative Deviation, etc.

Other Columns

A column that collects and displays the runTime comparison will also be available. This is useful to see how much faster one design is than another.

Waveform Import

Figure 80:

Often designers are required to add plots of some of their results to their spec sheet for the design review. Therefore graphs may be imported or copied into the bottom of the spec sheet GUI as illustrated in FIG. 80.

INDUSTRIAL APPLICABILITY

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A system having an integrated environment for the development and analysis of electronic circuits, comprising
    a user interface which allows a user to interact with the system;
    a plurality of simulation tools;
    a circuit design interface for inputting a circuit design;
    a model specification tool which allows said user to specify a computational model to be used for analysis of said circuit design; and,
    a plan specification tool which allows said user to specify a plan to be used with said computational model in analyzing, characterizing, or verifying said circuit design; and,
    wherein said plan can be selected by the user from a library of plans, and wherein each of said plans within said library of plans define the steps which must be followed in using said simulation tools to any of analyze, characterize, or verify the circuit design.

2. The system of claim 1 wherein said circuit design interface allows said user to import said circuit design into said integrated environment.

3. The system of claim 2 wherein said circuit design is in the form of a netlist.

4. The system of claim 1 further comprising a circuit design tool wherein said circuit design is input by said user via said design tool.

5. The system of claim 1 wherein the model is a Silicon Calibrated Behavioral Model.

6. The system of claim 1 wherein said model is user-defined.

7. The system of claim 1 further comprising a plan library wherein said plan specification tool allows said user to select said plan from said plan library.

8. The system of claim 1 wherein said plan specification tool allows a user to define said plan.

9. A system for circuit analysis, characterization, and verification, comprising:
    a user interface;
    a plurality of simulation tools;
    a plan creation wizard accessed by said user interface and configured to prompt the user to enter selections that are then used to create or modify a plan; and,
    a set of plans accessed either from within or without the user interface, wherein each of said set of plans defines the steps to be taken for a process including one of analyzing, characterizing, or verifying a particular circuit or device under test.

10. The system of claim 9 wherein the plan is a PERL script.

11. The system of claim 9, wherein said set of plans includes one or more of
    a characterization plan, including a script and associated tests that define the steps necessary to create characterization results;
    a model generation plan, including a script and associated tests that define the steps necessary to generate a silicon calibrated behavioral model for a target circuit or device under test; and,
    a synthesis plan, including a script, associated tests, and netlist elements that define the steps necessary to create a class of circuit that meets a specified performance criteria.

12. The system of claim 9 wherein the plan may be executed by the user from within the user interface.

13. The system of claim 9 wherein the plan may be executed by the user outside of and independently of the user interface, using a command-line interface.

14. The system of claim 9 including
    projects, said projects associated with tools.

15. A system for interactive analysis, characterization, and verification of electronic circuits, for use in electronic circuit design, comprising:
    a user interface that allows a user to interact with the system and to create, modify, and execute plans;
    a plurality of simulation tools that are used to analyze, simulate, and create electronic circuits or devices;
    a library that includes information defining cells and views associated therewith, wherein each cell represents a portion of the circuit or device being analyzed, and wherein each view contains a collection of files that represent a specific representation of said cell, and further wherein said specific representation is understood by one or more of said plurality of simulation tools;
    a plan creation wizard accessed by said user interface and configured to prompt the user to enter selections that are then used to create or modify a plan, said prompts including requests for user input or allowing the user to map characterization results to core model parameters; and,
    a set of plans accessed either from within or without the user interface, wherein each of said set of plans defines the steps to be taken for a process including one of analyzing, characterizing, or verifying a particular circuit or device under test.

16. The system of claim 15 wherein the plan is a PERL script.

17. The system of claim 15, wherein said set of plans includes one or more of a characterization plan, including a script and associated tests that define the steps necessary to create characterization results;

a model generation plan, including a script and associated tests that define the steps necessary to generate a silicon calibrated behavioral model for a target circuit or device under test; and, a synthesis plan, including a script, associated tests, and netlist elements that define the steps necessary to create a class of circuit that meets a specified performance criteria.

18. The system of claim 15 wherein the plan may be executed by the user from within the user interface.

19. The system of claim 15 wherein the plan may be executed by the user outside of and independently of the user interface, using a command-line interface.

20. The system of claim 15 including projects associated with said simulation tools.

21. A system providing a design environment for the analysis, characterization, verification, and model generation of electronic circuits, for use in electronic circuit design, comprising:

an intuitive user interface that allows a user to interact with the system;

a schematic capture environment tightly integrated within the design environment and with said graphical user interface that allows the user to reference and to work with one or a plurality of circuit designs;

a plurality of simulation tools;

a specification sheet tool, operable via said graphical user interface, that manages data from simulations to be performed on a circuit design, and presents the user with a pass/fail status of tests run by said plurality of simulation tools on said circuit design; and, a plan building tool for use in developing plans, wherein said plans define the steps which must be followed in using said simulation tools to any of analyze, characterize, or verify the circuit design.

22. The system of claim 21 wherein said plan building tool allows a user to run the simulation tools outside the user interface.

23. The system of claim 21 wherein said plurality of simulation tools includes a documentation tool that allows a user to create design documentation and to keep that documentation with the design setup.

24. The system of claim 21 wherein said plurality of simulation tools includes a set of advanced analysis tools including sweeps, corners, monte carlo and optimization, that work on one or many different circuit designs simultaneously.

25. The system of claim 21 wherein said plurality of simulation tools includes a calibration tool to calibrate a behavioral model to match the results of the original circuit design.

26. The system of claim 21 wherein said plurality of simulation tools includes a behavioral model tool that automatically creates a behavioral model and everything required to calibrate, characterize and verify that model using only high level information from the circuit designer or user.

27. The system of claim 21 wherein the simulation environment can work with multiple circuit and mixed-signal simulators.

28. The system of claim 21 further comprising:

a circuit design interface that allows said user to reference said circuit designs into said integrated environment.

29. The system of claim 28 wherein said circuit designs are in the form of text netlists or schematics.

30. The system of claim 26 wherein the model generation tool allows said user to create a user-defined model.

31. The system of claim 21 further comprising:

a plan library wherein said plan building tool allows said user to select said plan from said plan library.

32. The system of claim 31 wherein said plan building tool allows a user to define said plan.

33. A system for use with a circuit simulation environment that includes a plurality of simulation tools, for use in circuit design analysis, comprising:

a user interface that allows a user to interact with the system and with a spec sheet;

a spec sheet, operable by said user using the user interface, that manages the data from simulations being performed on a particular circuit design, and presents the user with a pass/fail status of tests run on said particular circuit design; and, a plan building tool for use in developing plans, wherein said plans define the steps which must be followed in using said simulation tools to any of analyze, characterize, or verify the circuit design.

* * * * *